United States Patent
Agashe et al.

(10) Patent No.: US 8,467,349 B2
(45) Date of Patent: Jun. 18, 2013

(54) METHODS AND APPARATUS FOR IN-ORDER DELIVERY OF DATA PACKETS DURING HANDOFF

(75) Inventors: Parag Arun Agashe, San Diego, CA (US); Nileshkumar J. Parekh, San Diego, CA (US); Peerapol Tinnakornsrisuphap, San Diego, CA (US); Donald William Gillies, San Diego, CA (US); Fatih Ulupinar, San Diego, CA (US); Rohit Kapoor, San Diego, CA (US); Rajat Prakash, La Jolla, CA (US); Avneesh Agrawal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1255 days.

(21) Appl. No.: 12/175,382

(22) Filed: Jul. 17, 2008

(65) Prior Publication Data

US 2009/0040981 A1    Feb. 12, 2009

Related U.S. Application Data

(60) Provisional application No. 60/951,176, filed on Jul. 20, 2007, provisional application No. 60/971,500, filed on Sep. 11, 2007, provisional application No. 60/972,722, filed on Sep. 14, 2007, provisional application No. 60/973,095, filed on Sep. 17, 2007.

(51) Int. Cl.
*H04W 4/00* (2009.01)

(52) U.S. Cl.
USPC ............ 370/331; 370/310; 370/315; 370/329

(58) Field of Classification Search
None
See application file for complete search history.

(56) References Cited

U.S. PATENT DOCUMENTS

| | | | | |
|---|---|---|---|---|
| 6,463,285 | B1* | 10/2002 | Davies et al. | 455/436 |
| 7,307,971 | B2 | 12/2007 | Park et al. | |
| 8,014,265 | B2 | 9/2011 | Sarkar et al. | |
| 2003/0210710 | A1* | 11/2003 | Odman | 370/471 |
| 2004/0233883 | A1* | 11/2004 | Ludwig et al. | 370/338 |
| 2005/0237962 | A1 | 10/2005 | Upp et al. | |
| 2006/0245373 | A1 | 11/2006 | Bajic | |

(Continued)

FOREIGN PATENT DOCUMENTS

| | | |
|---|---|---|
| EP | 1124398 A1 | 8/2001 |
| EP | 1983698 A1 * | 10/2008 |

(Continued)

OTHER PUBLICATIONS

International Search Report—PCT/US08/070528, International Search Authority—European Patent Office, Dec. 22, 2008.

(Continued)

*Primary Examiner* — Hassan Phillips
*Assistant Examiner* — Gautam Sharma
(74) *Attorney, Agent, or Firm* — Francois A. Pelaez

(57) ABSTRACT

Methods, apparatus, systems and computer program products are defined that provide for in-order deliver of data packets during hand-off. The aspects provide for in-order delivery at Forward Link Serving eBS/Data Attachment Point (FLSE/DAP) switch and Reverse Link Serving eBS/Data Attachment Point (RLSE/DAP) switch. As such, present aspects provide for significant improvement in the throughput of applications, such as applications relying on Transmission Control Protocol (TCP), during handoff, in such networks as Ultra Mobile Broadband (UMB) and the like.

56 Claims, 14 Drawing Sheets

U.S. PATENT DOCUMENTS

| | | | |
|---|---|---|---|
| 2007/0099578 A1 | 5/2007 | Adeney et al. | |
| 2007/0160156 A1 | 7/2007 | Melzer et al. | |
| 2007/0291695 A1* | 12/2007 | Sammour et al. | 370/331 |
| 2009/0103445 A1* | 4/2009 | Sammour et al. | 370/252 |
| 2009/0323533 A1* | 12/2009 | Ohta | 370/236 |
| 2010/0002650 A1* | 1/2010 | Ahluwalia | 370/331 |
| 2010/0111036 A1* | 5/2010 | Iwamura | 370/331 |
| 2010/0195598 A1 | 8/2010 | Wang | |

FOREIGN PATENT DOCUMENTS

| | | |
|---|---|---|
| JP | 2001275154 A | 10/2001 |
| JP | 2007129591 | 5/2007 |
| KR | 20050058775 A | 6/2005 |
| RU | 2265959 | 12/2005 |
| WO | WO2006130865 | 12/2006 |
| WO | WO2007011190 A1 | 1/2007 |
| WO | WO2007052904 A1 | 5/2007 |
| WO | WO2007074514 A1 | 7/2007 |
| WO | WO2009023860 | 2/2009 |

OTHER PUBLICATIONS

Written Opinion—PCT/US08/070528, International Search Authority—European Patent Office, Dec. 22, 2008.

Joachin Sachs et al, "Evaluation of Handover Performance for TCP Traffic Based on Generic Link Layer Context Transfer," Personal, Indoor and Mobile Radio Communications, 2006 IEEE, Sep. 1, 2006, pp. 1-5. XP031023532.

Ericsson, "Discussion on Automatic Neighbour Relation Lists for Lte" 3GPP TSG-SA5 (Telecom Management) Meeting SA5#53, S5-070974, May 7-11, 2007, pp. 1-5.

Taiwan Search Report—TW097127555—TIPO—May 9, 2012.

* cited by examiner

METHODS AND APPARATUS FOR IN-ORDER DELIVERY OF DATA PACKETS DURING HANDOFF

CLAIM OF PRIORITY UNDER 35 U.S.C. §119

The present application for patent claims priority to Provisional Application Nos. 60/951,176, entitled METHOD, APPARATUS AND SYSTEM FOR PRESERVING PACKET ORDER DURING HAND-OFF, filed Jul. 20, 2007; 60/971,500, entitled IN-ORDER DELIVERY ALGORITHMS FOR FLSA/DAP SWITCH IN UMB, filed Sep. 11, 2007; 60/972,722, entitled IN-ORDER DELIVERY ALGORITHMS FOR FLSA/DAP SWITCH IN UMB, filed Sep. 14, 2007; and 60/973,095, entitled METHOD AND APPARATUS FOR IN-ORDER DELIVERY OF PACKETS AT REVERSE LINK HANDOFF, filed Sep. 17, 2007. All of these Provisional Applications have been assigned to the assignee hereof and are hereby expressly incorporated by reference herein.

BACKGROUND

1. Field

The described aspects relate to wireless communication networks, and more particularly, to apparatus, methods and systems for providing in-order delivery of data packets in wireless communication networks.

2. Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP LTE systems, and orthogonal frequency division multiple access (OFDMA) systems.

Generally, a wireless multiple-access communication system can simultaneously support communication for multiple wireless terminals, otherwise referred to as access terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out, multiple-in-single-out or a multiple-in-multiple-out (MIMO) system.

The term "handoff" refers to the process of transferring an ongoing call or data session from one node of the core network to another node of the core network. In wireless communication networks there may be multiple reasons why a handoff might occur. These reasons include, but are not limited to, when an access terminal moves away from the area covered by one cell and enters the area covered by another cell, the call is transferred (i.e., handed-off) to the second cell in order to avoid call termination when the access terminal moves outside the range of the first cell. Additionally, when the capacity for connecting new calls on a given cell is exhausted and an existing or new call from an access terminal, which is located in an area overlapped by another cell, is transferred to that cell in order to free-up some capacity in the first cell for other users.

The most basic form of handoff (handover) is when a call in progress is redirected from its current cell, referred to as the source, and the used channel in that cell to a new cell, referred to as a target, and a new channel. In terrestrial networks the source and the target cells may be served from two different cell sites or from one and the same cell site (in the latter case the two cells are usually referred to as two sectors on that cell site). Such a handoff, in which the source and the target are different cells, even if they are on the same cell site, is called inter-cell handoff. The purpose of inter-cell handoff is to maintain the call as the subscriber is moving out of the area covered by the source cell and entering the area of the target cell. A special case is possible, in which the source and the target are one and the same cell and only the used channel is changed during the handoff. Such a handoff, in which the cell is not changed, is called intra-cell handoff. The purpose of intra-cell handoff is to change one channel, which may be experiencing interference or fading with a new clearer or less fading channel.

Conventional wireless communication includes two types of data packets; Layer 2 (L2) and Layer 3 (L3). L3 data packets include application layer protocol data, for example, Internet Protocol (IP) data packets. L2 data packets are constructed by link-layer protocol to make the packets more suitable for communication over a wireless link. Thus, L2 data packets need to be processed again by a peer link-layer protocol to reconstruct the L3 packets. L2 data packets may be constructed by a first network entity and tunneled to a second network entity to be transmitted to the Access terminal (AT) via the second network entity. The L2 layer carries, e.g. Radio Link Protocol (RLP) data packets, and Route Protocol (RP) packets.

One problem associated with handoffs is that L2 data packets can be delivered and/or received out-of-order at the application layer. For an L2 handoff, which is a switch in the physical layer to a different access point, out-of-order packets are due to a new or different Radio Link Protocol (RLP) in the new route. In a network such as an Ultra Mobile Broadband network or the like, on the forward link, packets typically traverse the Access Gate Way (AGW) to the Data Attachment Point (DAP) to the evolved Base Station (eBS), and then they are sent wirelessly via RLP to the access terminal. When an access terminal performs an L2 handoff, RLP packets are tunneled from the source eBS to the target eBS, and sent to the access terminal. Thus, the target eBS and AT must manage two competing streams of RLP packets, the one tunneled from the source eBS, and the one generated locally by the local RLP. If the handoff is not well-managed, packets from the source eBS may be delayed or discarded causing a stall in communication or an inability to reassemble full IP packets, respectively, resulting in IP packet loss.

Another problem associated with handoffs is that L3 data packets can be delivered and/or received out-of-order at the application layer. For an L3 handoff, Internet Protocol (IP) data packets flow from the Access Gateway (AGW) to the source DAP to the target eBS on one path, and the AGW to the target DAP to the target eBS on another path. The target DAP and target eBS are often co-located or closer together, so that after handoff, packets traverse fewer network hops. Thus, in a UMB network or the like, on the forward link, when an L3 handoff is performed it causes the AGW to send packets directly to the target DAP/eBS. This path switch can cause Transmission Control Protocol (TCP) data packets to arrive out-of-order at the target eBS and, subsequently to the AT and the associated application being executed at the AT, because direct packets from the AGW to the target eBS take a shorter path than packets still in transit from the source DAP to the target eBS. At the Application Layer certain applications are adversely affected by out-of-order delivery of packets. For example, an application implementing TCP may be negatively impacted because out-of-order packet delivery may cause the TCP receiver to generate duplicate ACKnowledgement (ACK) messages, and cause TCP to react by reducing its congestion window.

Therefore a need exists to develop a scheme to prevent out-of-order delivery of data packets during hand-off. The desired methods, apparatus, systems and the like should increase the overall performance of AT-based applications that are adversely affected by out-of-order delivery of data packets. Additionally, the desired scheme should address Forward Link Serving eBS network and/or DAP handoffs that occur in networks such as UMB, as well as, Reverse Link Serving eBS and/or DAP handoffs.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Methods, apparatus, systems and computer program products are provided for in-order deliver of data packets during hand-off. The aspects provide for in-order delivery at Forward Link Serving eBS/Data Attachment Point (FLSE/DAP) switch and Reverse Link Serving eBS/Data Attachment Point (RLSE/DAP) switch. As such, present aspects provide for significant improvement in the throughput of Access Terminal (AT)-based applications, such as applications relying on Transmission Control Protocol (TCP) during handoff, in such networks as UMB and the like.

According to one aspect, a method is defined for providing in-order delivery of data packets during handoff in a communication network. The method is directed to a forward link handoff and occurs at a target network entity, such as a target base station or the like. The method includes providing for a handoff of an Access Terminal (AT) from a source network entity to a target network entity; and prioritizing a transmission order of data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) and destined for transmission to the AT. The method further includes transmitting, at the target network entity, the received data packets according to the at least one of the first prioritization or the second prioritization.

At least one processor configured for providing in-order delivery of data packets during handoff in a communication network defines a related aspect. The processor includes a first module for providing for a handoff of an Access Terminal (AT) from a source network entity to a target network entity, a second module for prioritizing a transmission order of data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) and destined for transmission to the AT. Also, the method includes a third module for receiving data packets. Additionally, the processor includes a fourth module for transmitting the received data packets according to the at least one of the first prioritization or the second prioritization.

Another related aspect is provided for by a computer program product that includes computer-readable medium. The medium includes a first set of codes for causing a computer to provide for a handoff of an Access Terminal (AT) from a source network entity to a target network entity, a second set of codes for causing the computer to prioritize a transmission order of data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) and destined for transmission to the AT. Also, the medium includes a third set of codes for causing the computer to receive data packets at the target network entity Additionally, the medium includes a fourth set of codes for causing the computer to transmit the received data packets according to the at least one of the first prioritization or the second prioritization.

An apparatus defines yet another aspect. The apparatus includes means for providing for a handoff of an Access Terminal (AT) from a source network entity to a target network entity, means for prioritizing a transmission order of data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) and destined for transmission to the AT. Also, the apparatus includes means for receiving data packets. Additionally, the apparatus includes means for transmitting received data packets according to the at least one of the first prioritization or the second prioritization.

A further related aspect is provided for by a target network apparatus, such as a target base station or the like. The target network apparatus includes a computer platform including a processor and a memory in communication with a processor. The apparatus additionally includes a handoff module stored in the memory and in communication with the processor. The handoff module is operable to assist in a handoff of an Access Terminal (AT) from a source network entity to a target network entity. The apparatus also includes a transceiver in communication with the processor. The transceiver is operable to receive data packets destined for transmission to the AT. The apparatus also includes a data packet prioritization module stored in the memory and in communication with the processor. The prioritization module is operable to prioritize a transmission order of data packets, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) and destined for transmission to the AT, and to transmit the received data packets according to the at least one of the first prioritization or the second prioritization.

Yet another aspect is defined by a method for providing in-order delivery of data packets during handoff in a communication network. The method is directed to a forward link handoff and occurs at a source network entity, such as a source base station or the like. The method includes providing for a handoff of an Access Terminal (AT) from a source network entity to a target network entity, forwarding, from the source network entity, Layer 2 (L2) data packets, destined for the AT, to the target network entity and forwarding, from the source network entity, Layer 3 (L3) data packets, destined for the AT, to the target network entity. The method further requires that forwarding of the L2 data packets be prioritized over forwarding of the L3 data packets.

A related aspect is defined by at least one processor configured to provide in-order delivery of data packets during handoff in a communication network. The processor includes a first module for providing for a handoff of an Access Terminal (AT) from a source network entity to a target network entity and a second module for forwarding Layer 2 (L2) data packets, destined for the AT, to the target network entity. The processor additionally includes a third module for forwarding Layer 3 (L3) data packets, destined for the AT, to the target network entity. Additionally, the forwarding of the L2 data packets is prioritized over forwarding of the L3 data packets.

A computer program product that includes a computer-readable medium defines a further related aspect. The medium includes a first set of codes for causing a computer to provide for a handoff of an Access Terminal (AT) from a source network entity to a target network entity and a second set of codes for causing a computer to forward Layer 2 (L2) data packets, destined for the AT, to the target network entity. The medium additionally includes a third set of codes for causing the computer to forward Layer 3 (L3) data packets, destined for the AT, to the target network entity. Additionally, forwarding of the L2 data packets is prioritized over forwarding of the L3 data packets.

Yet another related aspect includes means for providing for a handoff of an Access Terminal (AT) from a source network entity to a target network entity, means for forwarding Layer 2 (L2) data packets, destined for the AT, to the target network entity and means for forwarding Layer 3 (L3) data packets, destined for the AT, to the target network entity. Additionally, forwarding of the L2 data packets is prioritized over forwarding of the L3 data packets.

A source network apparatus provides for yet another related aspect. The apparatus includes a computer platform including a processor and a memory in communication with a processor. The apparatus also includes a handoff module stored in the memory and in communication with the processor. The handoff module is operable to assist in the handoff of an Access Terminal (AT) from a source network entity to a target network entity. The apparatus additionally includes a transceiver stored in communication with the processor. The transceiver is operable to forward Layer 2 (L2) data packets, destined for the AT, to the target network entity and forwarding Layer 3 (L3) data packets, destined for the AT, to the target network entity. Additionally, the apparatus includes a data packet prioritization module stored in the memory and in communication with the processor. The prioritization module is operable to prioritize the forwarding of the L2 data packets over the L3 data packets.

Yet another method is defined that provides for in-order delivery of data packets during handoff in a communication network. The method is directed to a forward link handoff and occurs at an access terminal, such as a wireless communication device or the like. The method includes providing for handoff of an Access Terminal (AT) from a source network entity to a target network entity. The method further includes receiving, at the AT, L2 data packets transmitted from the source network entity and receiving, at the AT, data packets transmitted from the target network entity. Additionally, the method includes delivering the data packets to at least one respective application on the AT such that the L2 data packets transmitted from the source network entity are prioritized over the data packets transmitted from the target network entity.

At least one processor configured to provide in-order delivery of data packets during handoff in a communication network provides for a related aspect. The processor includes a first module for providing handoff of an Access Terminal (AT) from a source network entity to a target network entity, a second module for receiving L2 data packets transmitted from a source network entity and a third module for receiving data packets transmitted from a target network entity. Additionally, the processor includes a fourth module for delivering the data packets to at least one application on the AT such that the L2 data packets are prioritized over the data packets transmitted from the target network entity.

A computer program product defines yet another related aspect. The computer program product includes computer-readable medium. The medium includes a first set of codes for causing a computer to provide for handoff of an Access Terminal (AT) from a source network entity to a target network entity. The medium additionally includes a second set of codes for causing a computer to receive L2 data packets transmitted from the source network entity and a third set of codes for causing the computer to receive data packets transmitted from the target network entity. Additionally, the medium includes a fourth set of codes for causing the computer to deliver the data packets to at least one application on the AT such that the L2 data packets are prioritized over the data packets transmitted from the target network entity.

An apparatus provides for a still further related aspect. The apparatus includes means for providing handoff of an Access Terminal (AT) from a source network entity to a target network entity, means for receiving L2 data packets transmitted from the source network entity and means for receiving data packets transmitted from the target network entity. Additionally, the apparatus includes means for delivering the data packets to at least one application on the AT such that the L2 data packets are prioritized over the data packets transmitted from the target network entity.

Yet another related aspect is provided for by an access terminal device. The access terminal includes a computer platform including a processor and a memory in communication with a processor. The device additionally includes a handoff module stored in the memory and in communication with the processor. The handoff module is operable to assist in the handoff of an Access Terminal (AT) from a source network entity to a target network entity. Further, the device includes a transceiver stored in communication with the processor. The transceiver is operable to receive L2 data packets transmitted from a source network entity and receive data packets transmitted from a target network entity. Additionally, the transceiver is further operable to deliver the data packets to at least one application on the AT such that the L2 data packets from the source network entity are prioritized over the data packets transmitted from the target network entity.

Another method for providing in-order delivery of data packets during hand-off in a communications network provides for another aspect. The method is directed to a reverse link handoff and occurs at a target network entity, such as a target base station or the like. The method includes providing for handoff of an Access Terminal (AT) from a source network entity to a target network entity and receiving, at the target network entity, L2 packets partially processed prior to handoff, transmitted from an Access Terminal (AT). The method further includes forwarding, at the target network entity, the received L2 packets to the target network entity; and receiving, at the target network entity, an indication signal transmitted from the source network entity. The indication signal indicates that all L2 packets from the AT have been forwarded to the source network entity.

At least one processor configured to provide in-order delivery of data packets during handoff in a communication network provides for still another related aspect. The processor includes a first module for providing for handoff of an Access Terminal (AT) from a source network entity to a target network entity and a second module for receiving, at the target network entity, L2 packets partially processed prior to handoff, transmitted from an Access Terminal (AT). The processor includes a third module for forwarding, at the target network entity, the received L2 packets to the target network entity; and a fourth module for receiving, at the target network entity, an indication signal transmitted from the source network entity. The indication signal indicates that all L2 packets from the AT have been forwarded to the source network entity.

A computer program product that includes a computer-readable medium defines yet another aspect. The computer-readable medium includes a first set of codes for causing a computer to provide for handoff of an Access Terminal (AT) from a source network entity to a target network entity and a second set of codes for causing a computer to receive, at the target network entity, L2 packets partially processed prior to handoff, transmitted from an Access Terminal (AT). The computer-readable medium additionally includes a third set of codes for causing a computer to forward, at the target network entity, the received L2 packets to the target network entity and a fourth set of codes for receive, at the target network entity, an indication signal transmitted from the source network entity. The indication signal indicates that all L2 packets from the AT have been forwarded to the source network entity.

An apparatus provides a still further aspect. The apparatus includes means for providing for handoff of an Access Terminal (AT) from a source network entity to a target network entity, means for receiving, at the target network entity, L2 packets partially processed prior to handoff, transmitted from an Access Terminal (AT), means for forwarding, at the target network entity, the received L2 packets to the target network entity and means for receiving, at the target network entity, an indication signal transmitted from the source network entity. The indication signal indicates that all L2 packets from the AT have been forwarded to the source network entity.

A further aspect is provided for by a target network apparatus that includes a computer platform including a processor and a memory in communication with a processor. The apparatus also includes a handoff module stored in the memory and in communication with the processor. The handoff module is operable to assist in the handoff of an Access Terminal (AT) from a source network entity to a target network entity. The apparatus also includes a transceiver in communication with the processor. The transceiver is operable to receive L2 packets transmitted from an Access Terminal (AT), forward the received L2 packets to the target network entity and receive an indication signal transmitted from the source network entity. The indication signal indicates that all L2 packets from the AT have been forwarded to the source network entity.

A method for providing in-order delivery of data packets during hand-off in a communications network provides for a further aspect. The method is directed to a reverse link handoff that occurs at an access terminal, such as a wireless communication device or the like. The method includes providing for handoff of an Access Terminal (AT) between a source network entity and a target network entity, transmitting L2 data packets partially processed prior to handoff to the source network entity via the target network entity and transmitting new data packets to the target network entity. Additionally, the target network entity forwards the IP data packets constructed from L2 data packets to the target network entity and the target network entity sends all L2 data packets to an Access Gateway (AGW) prior to sending the new data packets.

A further aspect is defined by at least one processor configured to provide in-order delivery of data packets during handoff in a communication network. The processor includes a first module for providing for handoff of an Access Terminal (AT) between a source network entity and a target network entity, a second module for transmitting L2 data packets partially processed prior to handoff to the source network entity via the target network entity and a third module for transmitting new data packets to the target network entity. Additionally, the target network entity forwards the L2 data packets to the source network entity and the source network entity sends all IP data packets constructed from L2 data packets to an Access Gateway (AGW) prior to sending the new data packets.

Yet another aspect is provided for by a computer program product that includes a computer-readable medium. The medium includes a first set of codes for causing a computer to provide for handoff of an Access Terminal (AT) from a source network entity to a target network entity, a second set of codes for causing the computer to transmit L2 data packets partially processed prior to handoff to the source network entity via the target network entity and a third set of codes for causing the computer to transmit new data packets to the target network entity. Additionally, the target network entity forwards the L2 data packets to the source network entity and the source network entity sends all IP data packets constructed from L2 data packets to an Access Gateway (AGW) prior to sending the new data packets.

An apparatus defines yet another aspect. The apparatus includes means for providing for handoff of an Access Terminal (AT) between a source network entity and a target network entity, means for transmitting L2 data packets partially processed prior to handoff to the source network entity via the target network entity and means for transmitting new data packets to the target network entity. Additionally, the target network entity forwards the L2 data packets to the source network entity and the source network entity sends all IP data packets constructed from L2 data packets to an Access Gateway (AGW) prior to sending the new data packets.

An access terminal device provides for a further aspect. The access terminal includes a computer platform including a processor and a memory in communication with a processor. The access terminal additionally includes a handoff module stored in the memory and in communication with the processor. The handoff module is operable to assist in the handoff of an Access Terminal (AT) from a source network entity to a target network entity. The device additionally includes a transceiver in communication with the processor. The transceiver is operable to transmit L2 data packets partially processed prior to handoff to the source network entity via the target network entity and transmitting new data packets to the target network entity. Additionally, the target network entity forwards the L2 data packets to the source network entity and the source network entity sends all IP data packets constructed from L2 data packets to an Access Gateway (AGW) prior to sending the new data packets.

Thus, presents aspects herein described and claimed provide for in-order deliver of data packets during hand-off. The aspects provide for in-order delivery at Forward Link Serving eBS/Data Attachment Point (FLSE/DAP) switch and Reverse Link Serving eBS/Data Attachment Point (RLSE/DAP) switch. As such, present aspects provide for a significant improvement in the throughput applications, such as applications relying on Transmission Control Protocol (TCP) during handoff, in such networks as UMB and the like.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote the elements, and in which.

DETAILED DESCRIPTION

Figure 1:
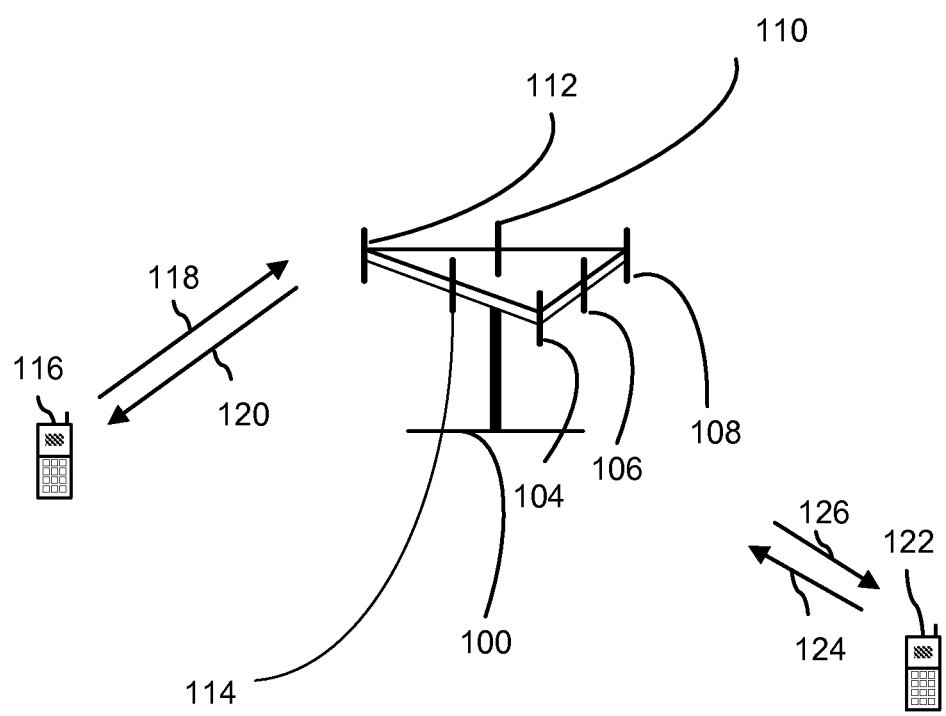
FIG. 1 is a schematic diagram of a multiple access wireless communication system according to one aspect.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

In addition, various aspects of the disclosure are described below. It should be apparent that the teaching herein can be embodied in a wide variety of forms and that any specific structure and/or function disclosed herein is merely representative. Based on the teachings herein one skilled in the art should appreciate that an aspect disclosed herein can be implemented independently of any other aspects and that two or more of these aspects can be combined in various ways. For example, an apparatus can be implemented and/or a method practiced using any number of the aspects set forth herein. In addition, an apparatus can be implemented and/or a method practiced using other structure and/or functionality in addition to or other than one or more of the aspects set forth herein. As an example, many of the methods, devices, systems and apparatuses described herein are descried in the context of determining characteristics of one or more wireless channels and providing a handover determination based in part on magnitudes of the determined characteristics. One skilled in the art should appreciate that similar techniques could apply to other communication environments.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with an access terminal, which can be a wired terminal or a wireless terminal. A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

According to present aspects, methods, apparatus, systems and computer-program products are defined for in-order deliver of data packets during hand-off. The aspects provide for in-order delivery at Forward Link Serving eBS/Data Attachment Point (FLSE/DAP) switch and Reverse Link Serving eBS/Data Attachment Point (RLSE/DAP) switch. As such, present aspects provide for significant improvement in the throughput at applications, such as applications relying on Transmission Control Protocol (TCP) during handoff, in such networks as UMB and the like.

Referring to FIG. 1, a multiple access wireless communication system according to one embodiment is illustrated. An access point 100 (AP) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over forward link 120 and receive information from access terminal 116 over reverse link 118. Access terminal 122 is in communication with antennas 104 and 106, where antennas 104 and 106 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In the embodiment, antenna groups each are designed to communicate to access terminals in a sector of the areas covered by access point 100.

In communication over forward links 120 and 126, the transmitting antennas of access point 100 utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and also may be referred to as an access point, a Node B, or some other terminology. An access terminal may also be called an access terminal, user equipment (UE), a wireless communication device, terminal, access terminal or some other terminology.

Figure 2:
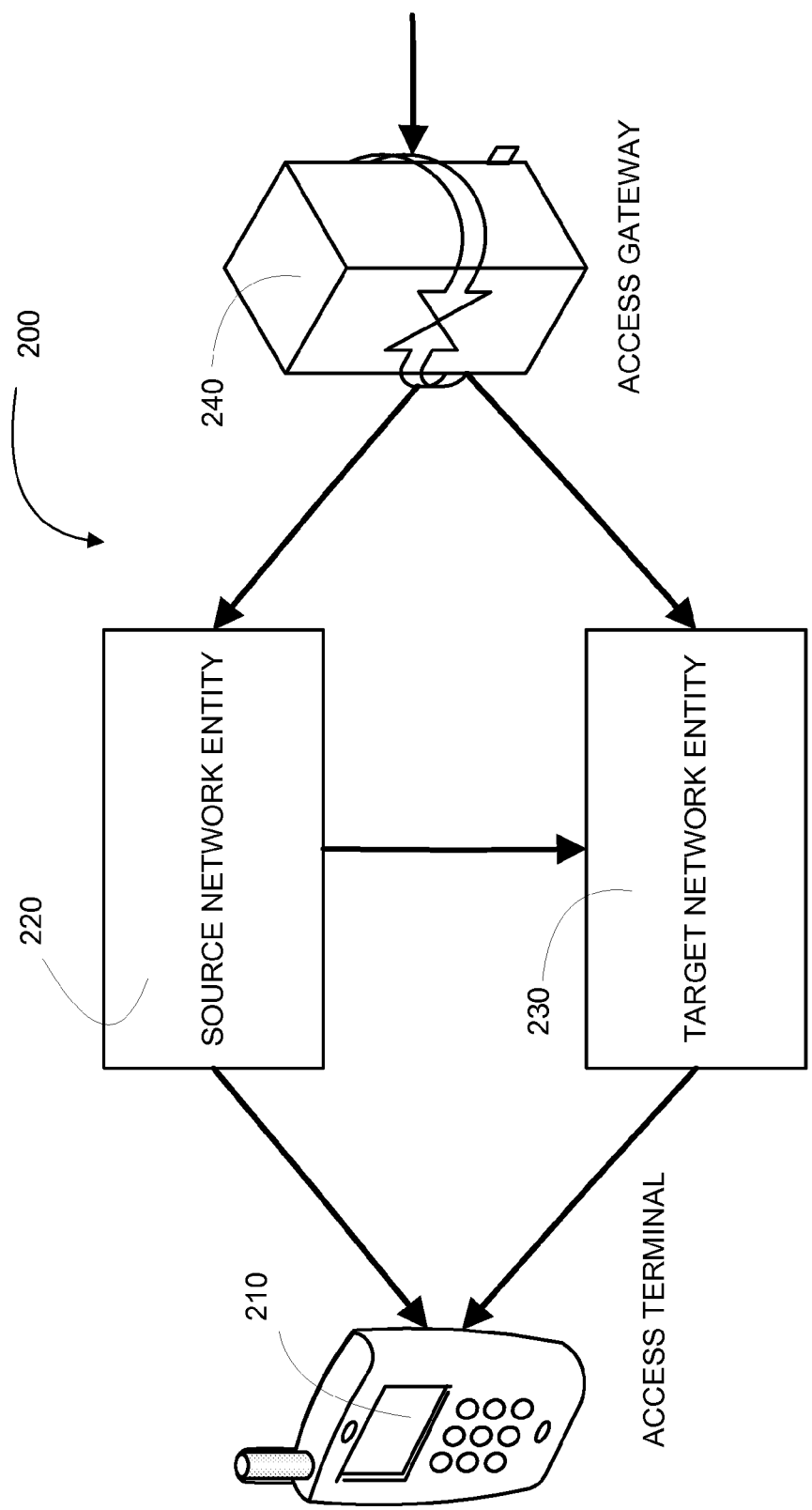
FIG. 2 is a schematic diagram of a system for in-order delivery of data packets during forward link handoff, according to aspect of the present innovation.

FIG. 2 is a schematic diagram of a system 200 for providing in-order delivery of data packets during forward link handoff in a communication network, in accordance with an aspect. The system includes an Access Terminal (AT) 210 that is being forward link handed off from a source network to a target network. Thus, the system 200 also includes a source network entity 220, such as source base stations, for example Forward Link Serving eBSs and/or source data attachment points located at access nodes or the like and a target network entity 230, such as target base stations, for example Forward Link Serving eBSs and/or target data attachment points located at access nodes or the like. The system additionally includes an Access GateWay (AGW) 240 that receives data packets from a core network (not shown in FIG. 2) across the forward link. Prior to L2 handoff, AT 210 communicates over-the-air, i.e., directly with the source network entity 220 and after L2 handoff AT 210 communicates over-the-air, i.e., directly with the target.

In general, source network entity 220 will forward Layer 2 (L2) and Layer 3 (L3) to target network entity 230 that were being processed during handoff. The L2 data packets may be in the form of partial data packets that have started transmission but not yet finished transmission over-the-air and/or any packets that have been processed by the link-layer protocol in the source network that have corresponding peer protocol in the AT 210. The L3 data packets may be in the form of Internet Protocol (IP) data packets that have not yet started transmission over-the-air. The source network entity 220 prioritizes the forwarding of data packets to the target network entity 230 such that L2 data packets are given first priority and the L3 packets are given second priority.

If the target network entity 230 is also receiving new data packets from the AGW 240 during handoff, then target network entity 230 prioritizes the receipt of data packets such that data packets from the source network entity 230 are given first priority and the data packets from AGW 240 are given second priority. In this regard, target network entity 230 buffers the new data packets until an indication is received from source network entity 230 that source network entity 230 has sent all remaining L2 and L3 data packets destined for AT 210.

AT 210 provides for prioritization such that L2 data packets forwarded from the source network entity 220 during the hand-off are given priority over any data packets transmitted from the target network entity 230 when the data packets are being delivered to applications residing at AT 210. Additionally, when source network entity 220 has exhausted all data packets destined for AT 210, source network entity 220 sends a flush signal or message, such as a flush packet, i.e., a data-less packet, to the AT 210. AT 210 only delivers data packets constructed from the source L2 data packets until the flush packet is received, then it begins delivering packets constructed from the target L2 packets. Target network entity 230 buffers any data packets destined for AT 210 until target network entity 230 receives an indication signal from source network entity 220 that all L2 and L3 data packets have been forwarded to the target network. Target network entity 230 then begins transmitting packets received from other sources than the source network entity to AT 210 only after target network entity 230 has transmitted all packets from the source network to AT 210. Thus, in other words, target network entity 230 prioritizes a transmission order of data packets according to at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for the AT, wherein the second prioritization comprises prioritizing L3 data packets received from the source network entity and destined for transmission to the AT over L3 data packets received from an Access GateWay (AGW) (or Data Attachment Point (DAP)) and destined for transmission to the AT.

Figure 3:
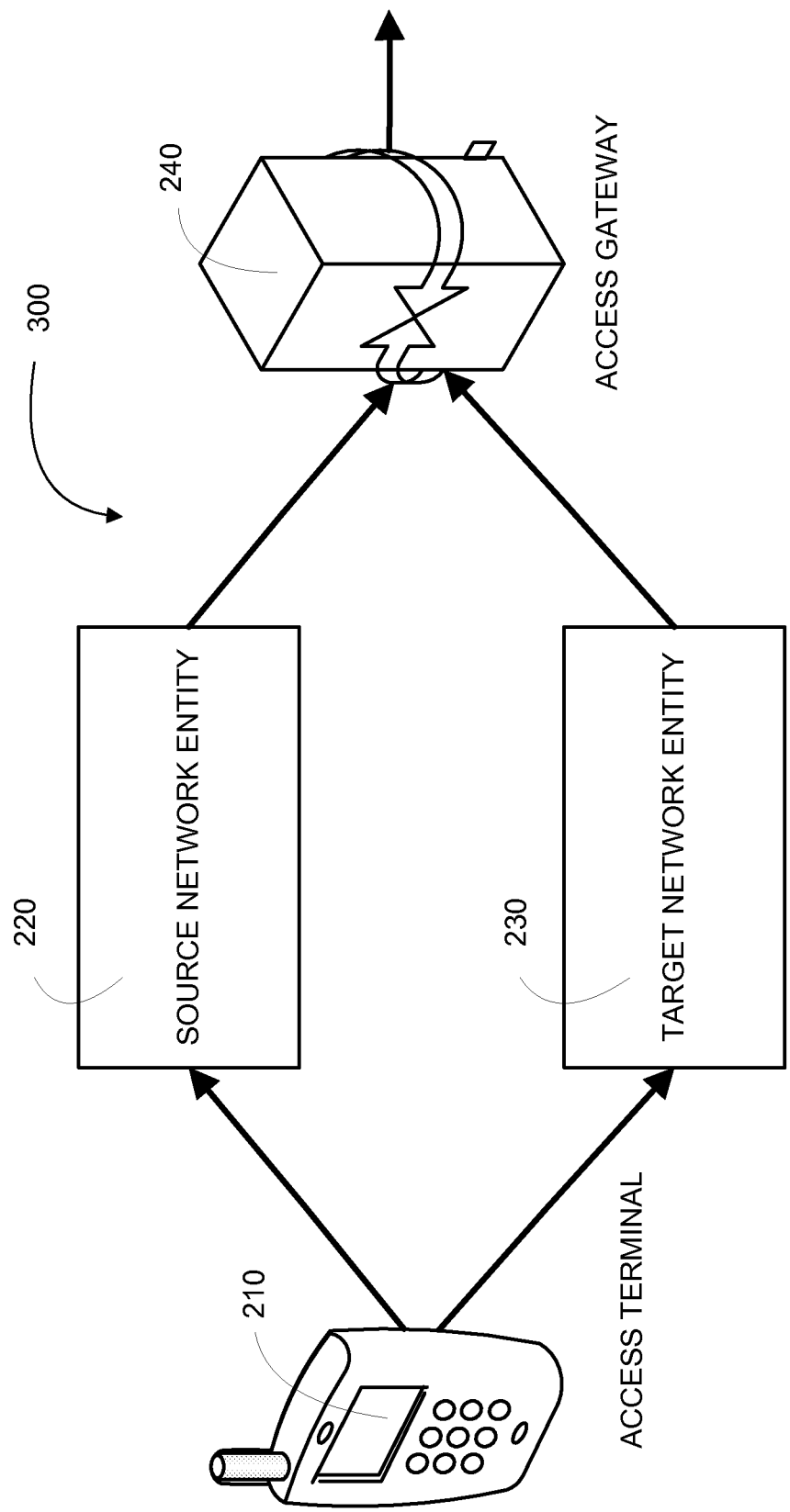
FIG. 3 is a schematic diagram of a system for in-order delivery of data packets during reverse link handoff, according to aspect of the present innovation.

Referring to FIG. 3, a schematic diagram is provided of a system 300 for providing in-order delivery of data packets during reverse link handoff in a communication network, in accordance with a further aspect. The system includes an Access Terminal (AT) 210 that is being reverse link handed off from a source network to a target network. Thus, the system 200 also includes a source network entity 220, such as source base stations located at a Reverse Link Serving eBS network and/or source data attachment points located at access nodes or the like and a target network entity 230, such as target base stations located at a Reverse Link Serving eBS network and/or target data attachment points located at access nodes or the like. The system additionally includes AGW 240 that transmits data packets to a core network (not shown in FIG. 3) across the reverse link.

In the reverse link scenario, data packets originate from a single source, i.e., AT 210. The purpose for in-order delivery on the reverse-link is to provide packets from applications that require in-order delivery at AGW 240 in the order that the packets were generated in AT 210. Thus, according to one aspect, AT 210 may send L2 data packets that were partially transmitted to the source network entity 220 but did not finish transmission over-the-air to source network entity 220. These partial data packets may be referred to herein as fragments. AT 210 send the partial packets to the source network entity 220 via a previously established protocol tunnel or source network entity 220 may establish a tunnel if one does not currently exist.

Additionally, AT 240 forwards new data packets to target network entity 230, which buffers the new data packets and does not send the new data packets to AGW 240 until target network entity 230 receives an indication signal from source network entity 220 that source network entity has completed forwarding of all of the partial data packets to AGW 240 or a predetermined period of time after handoff has elapsed.

Figure 4:
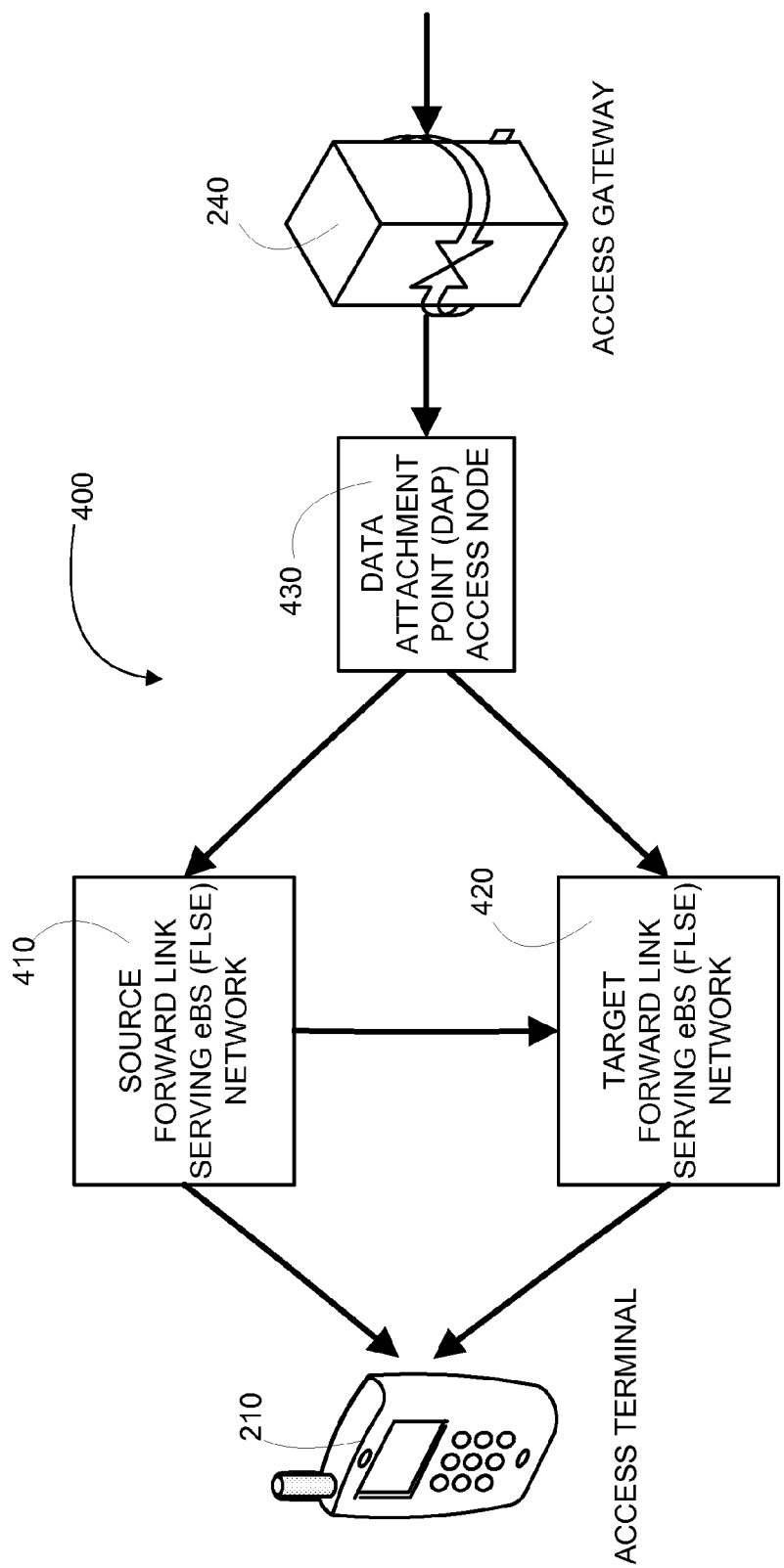
FIG. 4 is a schematic diagram of a system for in-order delivery of data packets during forward link handoff between access serving networks, according to aspect of the present innovation.

Referring to FIG. 4, a schematic diagram is provided of a specific system 400 for providing in-order delivery of data packets during a forward link handoff, according to an aspect. In the illustrated example the handoff occurs at the serving access network level. The system 400 includes an Access Terminal (AT) 210 that is provided forward link handed off from a source Forward Link Serving eBS (FLSE) network 410 to a target Forwards Link Serving Access (FLSE) network 420. The system additionally includes a Data Attachment Point (DAP) Access Node 430 and AGW 240 that forward data packets transmitted from a core network (not shown in FIG. 4) across the forward link. FIG. 4 will be discussed in relation to the actions taken by the specific nodes that comprise system 400.

Target FLSE

Target FLSE 420, upon detection of AT 210 sends an Internet Protocol Tunneling (IPT)-Notification to all ANs in the route set (not shown in FIG. 4) that indicates that the FLSE is the target FLSE. After sending the IPT-Notification, target FLSE 420 initiates a timer to indicate an allowable maximum waiting period for pending L3 data to be received. This timer is reset each time a tunneled IP packet from the source FLSE 410 is received by target FLSE 420. This timer is implemented to safeguard against instances in which a subsequently sent signaling message indicating no pending data, which is sent from the source FLSE 420 to the target FLSE, is lost or otherwise not properly received by the target FLSE 420.

Upon receiving tunneled L2 data packets from source FLSE 410, target FLSE 420 starts forwarding these data packets to AT 210 encapsulated in Inter Route Tunneling Protocol (IRTP) or the like on one Radio Link Protocol (RLP) stream. Upon receiving tunneled IP packets from source FLSE 410, target FLSE 420 starts forwarding these data packets to AT 210 on its own RLP stream. Target FLSE 420 provides scheduling priority to the tunneled partial L2 packets compared to the tunneled full IP packets. In this regard, in one aspect, target FLSE 420 starts forwarding the tunneled partial L2 data packets before starting to forward the tunneled full IP packets, but it may begin forwarding the tunneled full IP data packets while some partial L2 data packets are still in transmission or retransmission. As such, it is not required in every instance that the tunneled full IP data packets arrive at AT 210 after the tunneled L2 data packets.

Target FLSE 420 may not forward tunneled IP packets received directly from DAP 430, if DAP 430 is a separate entity apart from FLSE 420, or AGW 240 until an acknowledgement message indicating no pending data and previous FLSE is received, or the previous mentioned timer that defines the waiting period for pending L3 data expires. Once the acknowledgement message is received or the timer expires, target FLSE 420 may start transmitting IP packets received directly from DAP 430, after forwarding tunneled packets received from the source FLSE 410. Such processing insures that packets received tunneled from source FLSE 410 and tunneled from DAP 430 are forwarded in-order to AT 210.

Source FLSE

Upon receiving the IPT-Notification from target FLSE 420 indicating the change in the target, source FLSE 410 starts a timer indicating a waiting period for receiving IP packets from DAP 430. The timer is generally set to approximately twice the duration of the backhaul delay. In addition, upon receipt of the IPT-Notification, source FLSE 410 sends an acknowledgement message acknowledging receipt of the IPT-Notification and indicating pending data and previous FLSE status. According to certain aspects, this acknowledgement message is transmitted prior to waiting for partial L2 data packets currently in transmission to finish transmission.

Source FLSE 410 tunnels L2 packets to target FLSE 420 according to the following priority order. First priority is provided to partial packets that have been started but not finished transmission over-the-air at the source FLSE 410 and/or any packets that have been processed by the link-layer protocol in the source network that have corresponding peer protocol in the AT. Second priority is provided to IP packets that have not yet started transmission over-the-air at source FLSE 410. After all partial packets and IP packets have been tunneled, a flush signal or message, such as a flush packet, is sent to AT 210 via the target network entity. In one aspect, for example, the flush packet does not carry any data and it may have an RLP sequence number equivalent to the sequence number of the last byte sent from the RLP at source FLSE 410.

In most instances, source FLSE 410 is not required to transmit to AT 210 partial packets that were currently in transmission or IP data packets that have not yet started transmission. This is because these data packets are already being tunneled to target FLSE 420, so these is no significant added benefit to transmitting them on the source FLSE 410, as well. However, in some delay-sensitive applications, such as Voice over IP (VoIP) or the like, a benefit may be realized in terms of less delay by transmitting the partial packets and/or IP packets at the source FLSE 410.

Once the switch to the target FLSE 420 occurs, source FLSE 410 does not pull out any IP data packets or any new packets from the IP queue to transmit over-the-air.

After expiration of the timer indicating the waiting period for IP packets, meaning no data packets are in queue at the source FLSE 410 to be tunneled to target FLSE 420, source FLSE 410 sends an acknowledgement message to target FLSE 420 indicating no pending data and previous FLSE status.

DAP

It should be noted that the processing discussed in relation to DAP 430 is only required if the DAP is a separate entity apart from FLSE 420.

Upon receiving the IPT-Notification indicating that FLSE 420 is the target FLSE, DAP 430 sends an acknowledgement message indicating receipt of the IPT-Notification. Once the acknowledgement message is sent by DAP 430, DAP 430 starts sending full IP packets tunneled to target FLSE 420, according to the priority of the packets. As noted, other access nodes, upon receiving the IPT-Notification, send an acknowledgement message indicating receipt of the IPT-Notification.

AT

The AT will forward data packets to the corresponding application in-order based on the following scheme. If the timer indicating the waiting period for receipt of a flush signal or message, such as a flush packet, expires or the flush packet is received for the RLP stream receiving tunneled L2 packets and there are no unacknowledged or missing packets, AT 210 sends all data packets to the application. The timer indicating the waiting period for receiving the flush packet is generally started by AT 210 on the RLP stream receiving tunneled L2 data packets shortly after the FLSE switch occurs. This timer should be reset on every received packet. AT 210 forwards data packets from the RLP stream receiving IP packets to the application only after all data packets have been forwarded to the application from the RLP stream receiving the tunneled L2 packets from source FLSE 410. It should be noted that the priority rules employed at AT 210 are only implemented for flows requiring in-order delivery. For flows that can tolerate out-of-order delivery, such as VoIP or the like, data packets may be forwarded out-of-order.

Figure 5:
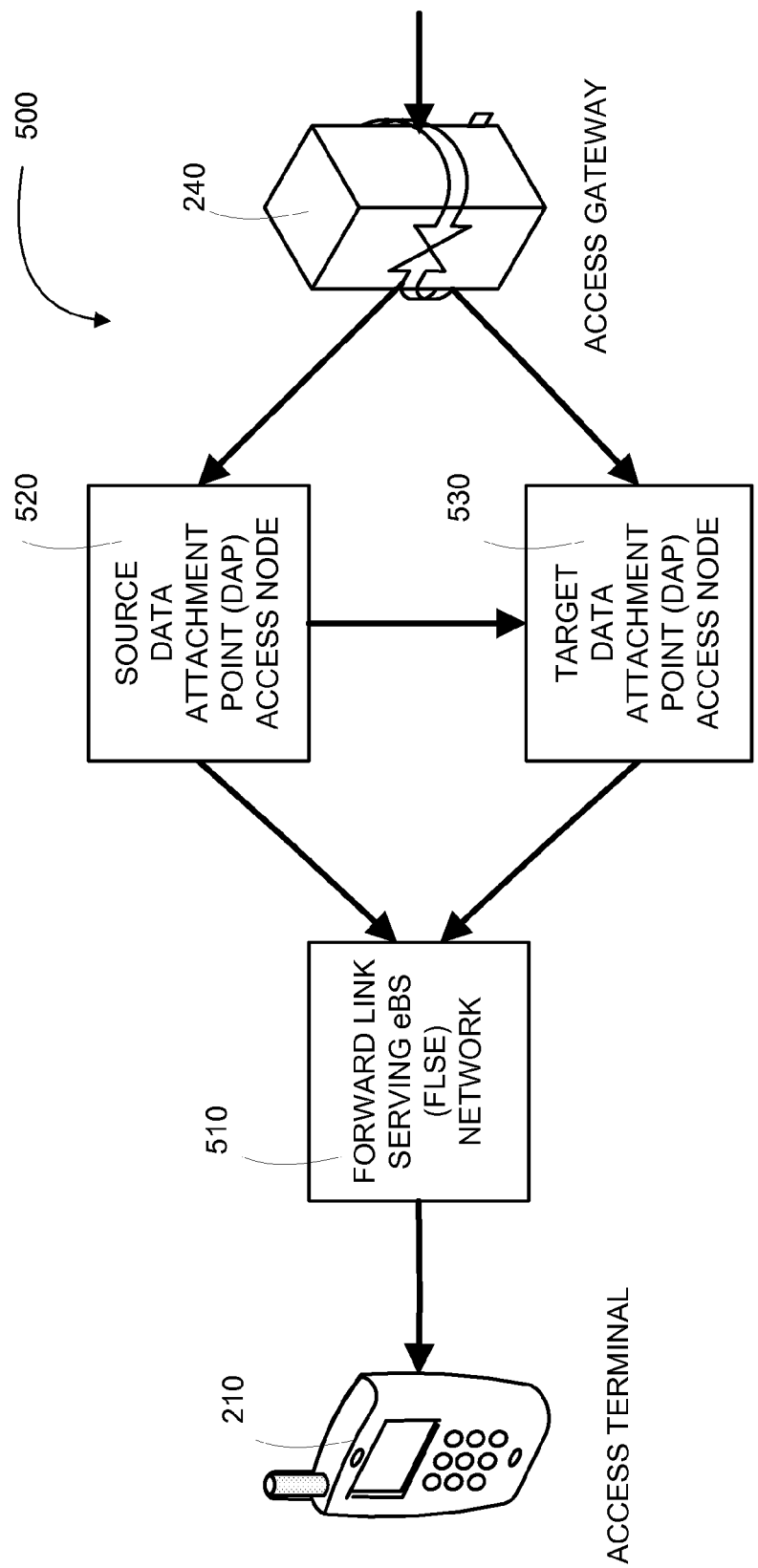
FIG. 5 is a schematic diagram of a system for in-order delivery of data packets during forward link handoff between data attachment points, according to aspect of the present innovation.

Referring to FIG. 5 a schematic diagram is provided of a specific system 500 for providing in-order delivery of data packets during a DAP handoff, according to an aspect. In the illustrated example the handoff occurs at the data attachment point level. The system 500 includes an Access Terminal (AT) 210 that is provided forward link handed off from a source DAP 520 to a target DAP 530. The system additionally includes a Forward Link Serving eBS 510 network and AGW 240 that forward data packets transmitted from a core network (not shown in FIG. 5) across the forward link. FIG. 5 will be discussed in relation to the actions taken by the specific nodes that comprise system 500.

Target DAP

Upon receipt of a DAP move request sent from AT 210, or the target DAP 530, if the target DAP makes the determination to become the target, target DAP 530 sends a registration request, such as Mobile Internet Protocol (MIP) or Proxy MIP registration request to AGW 240.

Once DAP 530 receives a response to the registration request from AGW 240, target DAP 530 send a DAP-Notification to source DAP 520 and FLSE 510, as well as to other ANs in the route set (not shown in FIG. 5). After sending the DAP Notification, target DAP 530 starts a timer indicating a waiting period for receiving pending L3 data packets. This timer is reset each time a tunneled IP data packet is received from source DAP 520. This timer is implemented to safeguard against instances in which a subsequently sent a signaling message that acknowledges no pending data, which is sent from source DAP 520 to target DAP 530, is lost or otherwise not properly received by target DAP 530.

Target DAP 530 does not forward direct IP data packets received from AGW 240 to FLSE 510 until all IP packets from source DAP 520 have been forwarded to FLSE 510. The receipt of the acknowledgement message indicating no pending data and previous DAP, is used by target DAP 530 to know when the last packet from source DAP 520 has been received, so that target DAP 530 can begin forwarding direct IP packets.

Source DAP

Upon receipt of the DAP Notification sent from target DAP 530, the source DAP 520 starts a timer indicating the waiting period of IP packets. The value of timer may be equal to approximately the one-way delay between AGW 240 and the base station at FLSE 510 via the source DAP 520. In other words, in one aspect, the timer is set to a value so as to allow the old source/path of data packets to drain completely before recommencing communications at the target. Additionally, upon receipt of the DAP Notification sent from target DAP 530, source DAP 520 sends an acknowledgement message indicating receipt of the DAP Notification and indicating pending data and previous DAP status.

After the timer indicating the waiting period of receiving IP data packets expires, meaning no data packets are in queue to be tunneled to target DAP 530, source DAP 520 sends an IPT-Notification acknowledgement with no pending data and previous DAP status to target DAP 530.

FLSE

It should be noted that the processing discussed in relation to FLSE 430 is only required if the FLSE is a separate entity apart from the DAP.

Upon receipt of the IPT-Notification acknowledgement sent from source DAP 520 and indicating no pending data, FLSE 510 can start forwarding data packets directly received from AGW 240 or through target DAP 530 after having forwarded tunneled data packets received from source DAP 520.

AGW

Upon receipt of the registration request sent from target DAP 530, AGW 240 sends a registration response to target DAP 53. Once the response has been sent, AGW can begin forwarding data packets directly to target DAP 530.

Figure 6:
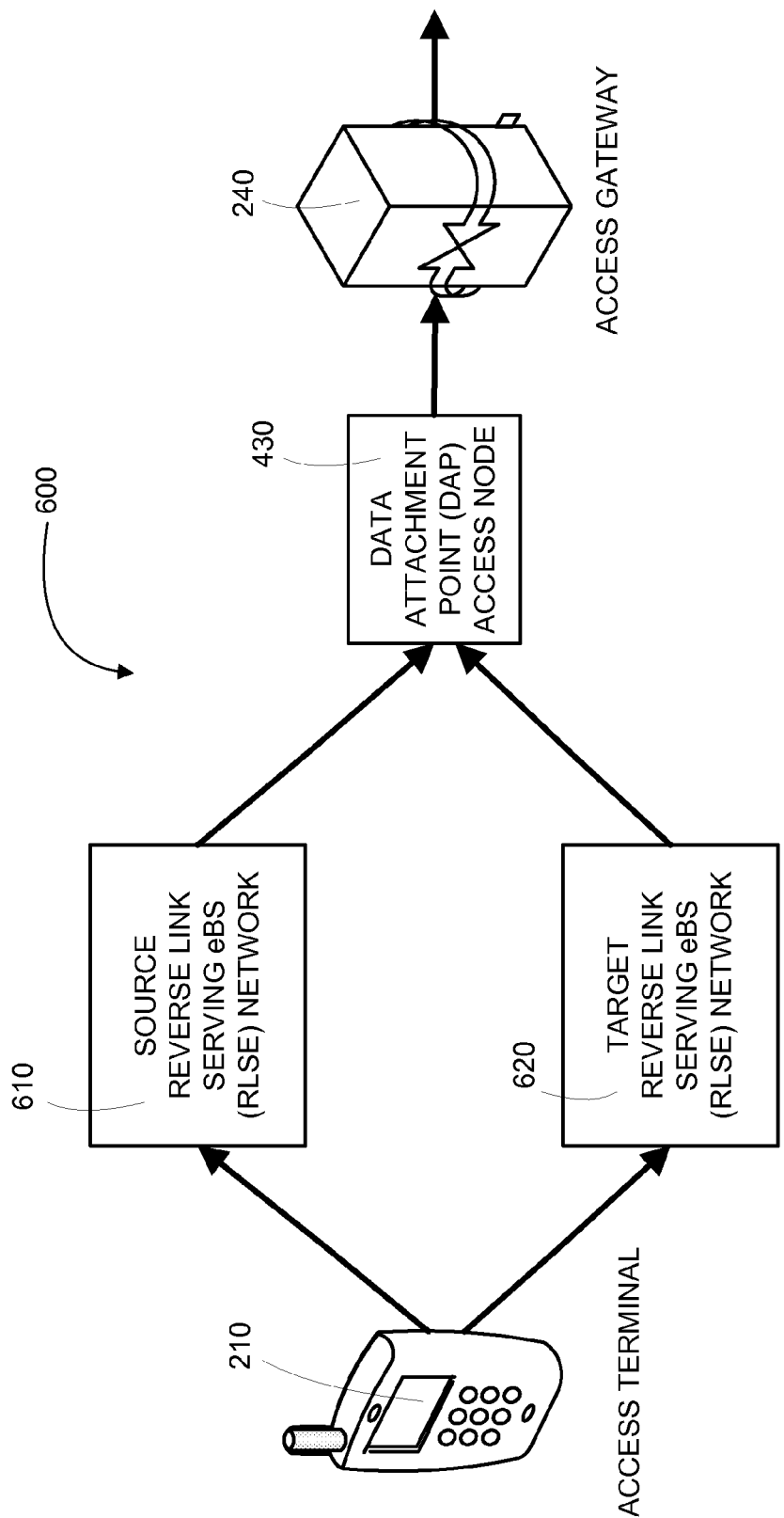
FIG. 6 is a schematic diagram of a system for in-order delivery of data packets during reverse link handoff between access serving networks, according to aspects.

Referring to FIG. 6, a schematic diagram is provided of a specific system 600 for providing in-order delivery of data packets during a reverse link handoff, according to an aspect. In the illustrated example the handoff occurs at the serving access network level. The system 600 includes an Access Terminal (AT) 210 that is provided forward link handed off from a source Reverse Link Serving eBS (FLSE) network 610 to a target Reverse Link Serving eBS (FLSE) network 620. The system additionally includes a Data Attachment Point (DAP) Access Node 430 and AGW 240 that forward data packets to a core network (not shown in FIG. 6) across the reverse link. FIG. 6 will be discussed in relation to the actions taken by the specific nodes that comprise system 600.

Target RLSE

Upon detecting AT 210, target RLSE 620 sends IPT-Notification to source RLSE 610 and DAP 430, as well as, other ANs in the route set (not shown in FIG. 6). The IPT Notification serves to inform that the RLSE 620 is the target RLSE.

Upon receiving an acknowledgement message indicating receipt of the IPT-Notification and indicating pending data and previous RLSE status, target RLSE 620 starts a timer indicating the waiting period for receiving L3 data packets. This timer is implemented to safeguard against instances in which the IPT-Notification indicating no pending data, which is sent from source RLSE 610 to target RLSE 620, is lost or otherwise not properly received by target RLSE 620. Additionally, target RLSE 620 assigns Reverse Link Assignment Block (RLAB) to AT 210.

For in-order delivery streams, target RLSE 620 may not forward the IP packets received from AT 210 on the target route to AGW 240 or DAP 430, until the IPT-Notification with no pending data is received from source RLSE 610 or the timer indicating the waiting period for receiving pending L3 data packets expires. For flows that can tolerate out-of-order delivery, such as VoIP or the like, data packets may not be required to be buffered at target RLSE 620 and can forwarded at any time.

Source RLSE

Upon receipt of the IPT-Notification sent from target RLSE 620, source RLSE 610 sends an acknowledgement message indicating receipt of the IPT-Notification and indicating pending data and previous RLSE status. The source RLSE 610 also starts a timer indicating a waiting period for a flush signal or message, such as a flush packet, for each stream requiring in-order delivery. This timer is reset each time a packet that has a larger sequence number than any previously received packet is received on the stream.

For all streams requiring in-order delivery, if the timer indicating the waiting period for receiving the flush signal or message, such as the flush packet, expires or the flush packet is received for the RLP route receiving tunneled L2 data packets and there are no unacknowledged or missing packets, source RLSE 610 sends an IPT-Notification to target RLSE 620 indicating no pending data and previous RLSE status.

DAP

Upon receiving the IPT-Notification from the target RLSE 620, DAP 430 sends an acknowledgement message indicating receipt of the IPT-Notification to target RLSE 620. All other nodes in the route set may also send an acknowledgement message upon receipt of the IPT-Notification indicating the same.

AT

After switching to target RLSE 620, AT 210 sends L2 data packets on the source RLSE route to target RLSE 620 in the following order. First priority is provided to partial packets that have been started but not finished transmission over-the-air at the source RLSE 610 and/or any packets that have been processed by the link-layer protocol in the source network that have corresponding peer protocol in the AT. After all partial packets and IP packets have been tunneled to the source RLSE 610, a flush signal or message, such as a flush packet, is sent. The flush packet does not carry any data and it may have an RLP sequence number equivalent to the sequence number of the last byte sent from the RLP at source RLSE 610. After sending the L2 partial packets on the source route, At 210 starts sending new packets to target RLSE 620 on the target route.

Figure 7:
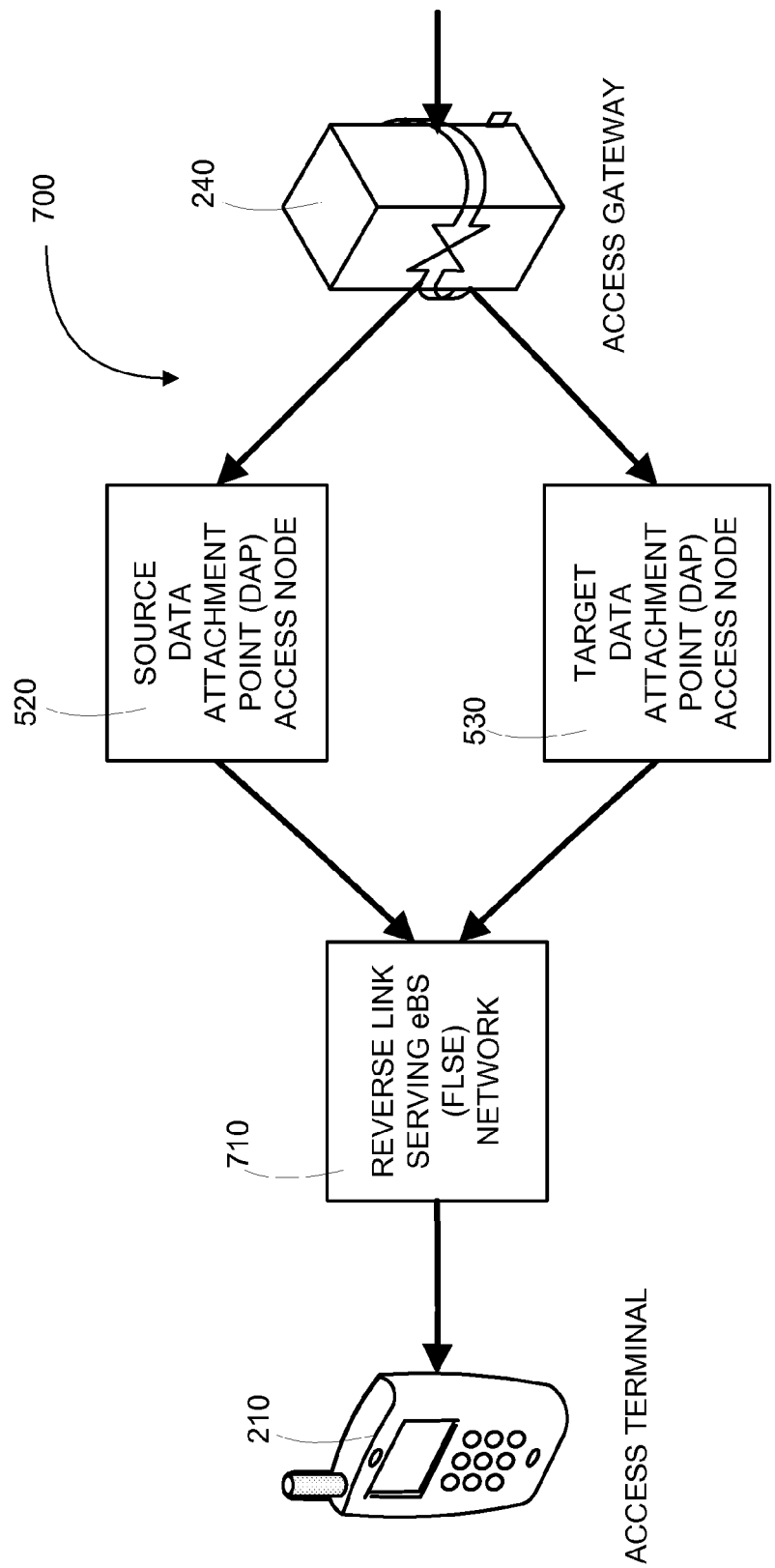
FIG. 7 is a schematic diagram of a system for in-order delivery of data packets during reverse link handoff between data attachment points, according to aspect of the present innovation.

Referring to FIG. 7 a schematic diagram is provided of a specific system 700 for providing in-order delivery of data packets during a DAP handoff, according to an aspect. In the illustrated example the handoff occurs at the data attachment point level. The system 700 includes an Access Terminal (AT) 210 that is provided reverse link hand off from a source DAP 520 to a target DAP 530. The system additionally includes a Reverse Link Serving eBS 710 network and AGW 240 that forward data packets transmitted from a core network (not shown in FIG. 7) across the forward link. FIG. 7 will be discussed in relation to the actions taken by the specific nodes that comprise system 700.

Target DAP

Upon receipt of a DAP move request sent from AT 210, target DAP 530 sends a registration request, such as Multiple Internet Protocol (MIP) or Proxy MIP registration request to AGW 240.

Once target DAP 530 receives a response to the registration request from AGW 240, target DAP 530 send a DAP-Notification to source DAP 520 and RLSE 710, as well as to other ANs in the route set (not shown in FIG. 7). After sending the DAP Notification, target DAP 530 starts a timer indicating a waiting period for receiving pending L3 data packets from source DAP 520. This timer is reset each time a tunneled IP data packet is received from source DAP 520. This timer is implemented to safeguard against instances in which a subsequently sent ACK that acknowledges no pending data, which is sent from source DAP 520 to target DAP 530, is lost or otherwise not properly received by target DAP 530.

Source DAP

Upon receipt of the DAP Notification sent from target DAP 530, source DAP 520 sends an acknowledgement message indicating receipt of the DAP Notification and indicating pending data and previous DAP status.

RLSE

Upon receipt of the DAP-Notification acknowledgement sent from target DAP 530, RLSE 510 starts a timer indicating the waiting period for receiving pending L3 data. The value of the time may be equal to approximately twice the backhaul delay between AGW 240 and the base station at the RLSE 710.

After the timer indicating the waiting period for receiving L3 packets expires, RLSE 710 can start tunneling data packets to target DAP 530.

AGW

Upon receipt of the registration request sent from target DAP 530, AGW 240 sends a registration response to target DAP 530.

Figure 8:
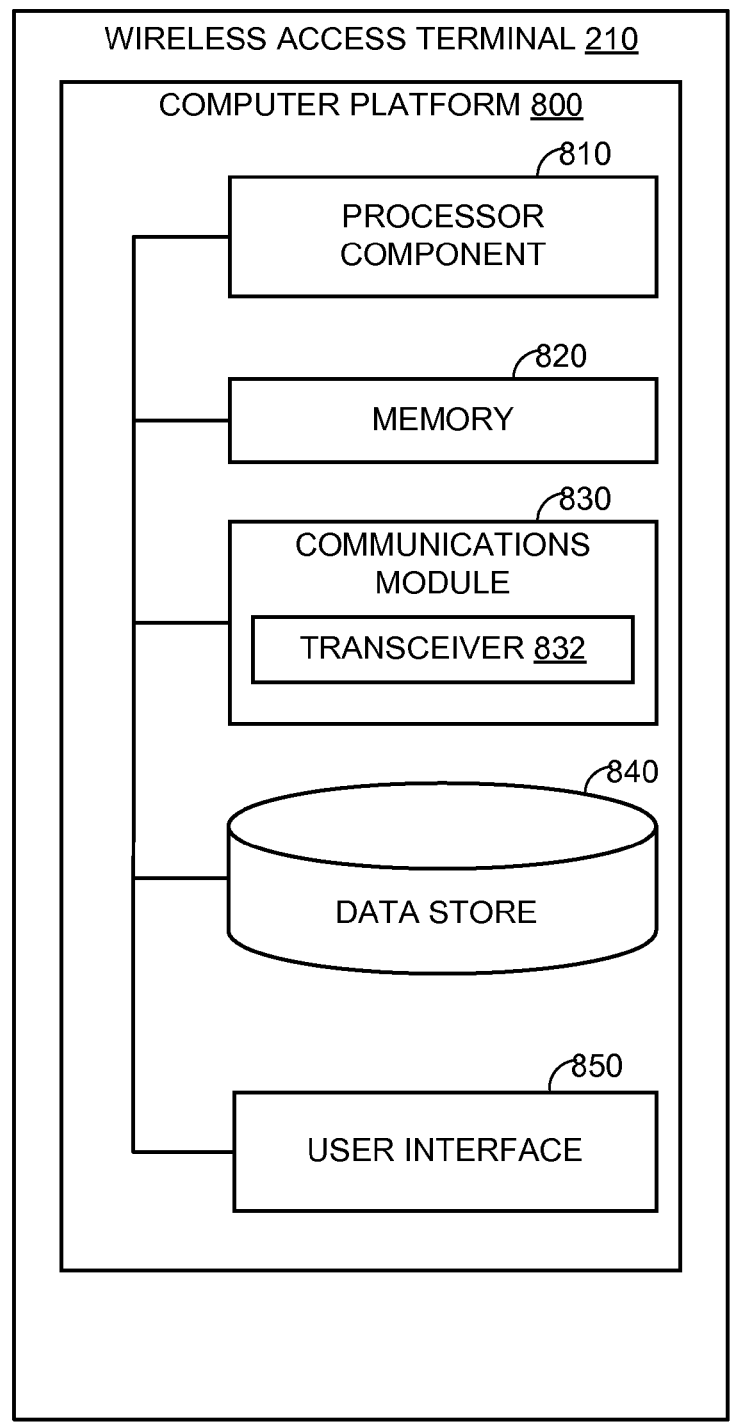
FIG. 8 is a block diagram depiction of an exemplary access terminal device, according to aspects herein disclosed.

Referring to FIG. 8, in one aspect, access terminal 210 comprises a mobile communication device, such as mobile telephone or the like, operable on a wireless communication system. As can be appreciated, there are a variety of wireless communication systems in addition to the UMB network, which often employ different spectrum bandwidths and/or different air interface technologies. Exemplary systems include CDMA (CDMA 2000, EV DO, WCDMA), OFDM, or OFDMA (Flash-OFDM, 802.20, WiMAX), FDMA/TDMA (GSM) systems using FDD or TDD licensed spectrums, peer-to-peer (e.g., mobile-to-mobile) ad hoc network systems often using unpaired unlicensed spectrums, and 802.xx wireless LAN or BLUETOOTH techniques.

Access terminal 210 includes processor component 810 for carrying out processing functions associated with one or more of components and functions described herein. Processor component 810 can include a single or multiple sets of processors or multi-core processors. Moreover, processing component 810 can be implemented as an integrated processing system and/or a distributed processing system. Additionally, processing component 810 may include one or more processing subsystems, such as processing subsystems capable of determining link quality or setting up link bindings according to present aspects, or any other processing subsystem needed to carry out present aspects.

Access terminal 210 further includes a memory 820, such as for storing local versions of applications/modules being executed by processor component 810. Memory 820 can include random access memory (RAM), read only memory (ROM), and a combination thereof. Additionally, in some aspects (not shown in FIG. 8), memory 820 includes handoff module, data packet prioritization module and the like.

Further, access terminal 210 includes a communications module 830 that provides for establishing and maintaining communications with one or more parties utilizing hardware, software, and services as described herein. Communications module 830 may carry communications between components on access terminal 210, as well as between access terminal 210 and external network devices, such as base stations 900 located across a communications network and/or devices serially or locally connected to access terminal 210. Additionally, communications module 830 may include transceiver 832 operable for transmitting data packets.

Additionally, access terminal 210 may further include a data store 840, which can be any suitable combination of hardware and/or software that provides for mass storage of information, databases, and programs employed in connection with aspects described herein.

Access terminal 210 may additionally include a user interface component 850 operable to receive inputs from a user of access terminal 210, and to generate outputs for presentation to the user. User interface component 850 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 850 may include one or more output devices, including but not limited to a display, a speaker, a haptic feedback mechanism, a printer, any other mechanism capable of presenting an output to a user, or any combination thereof.

Figure 9:
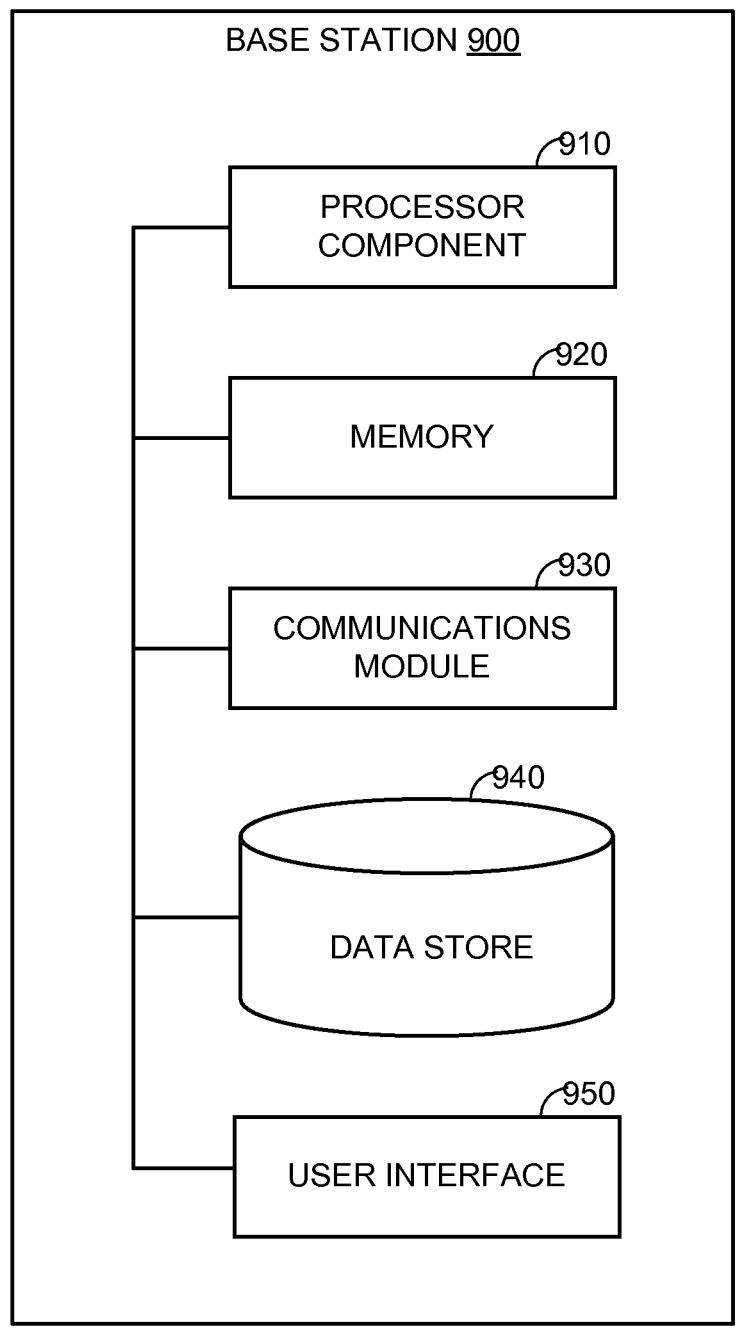
FIG. 9 is a is a block diagram of an exemplary base station, in accordance with another aspect of the innovation.

Referring to FIG. 9, in one aspect, a network entity, such as a Base Station (BS) 900 is operable to receive forward or reverse link data packets and provide for in-order delivery of the same. BS 900 includes any type of network-based communication device, such as a network server operable on a communication network. Communication network may be a wired or wireless communication system, or a combination of both, and includes the wireless network on which access terminal 210 operates.

BS 900 includes a processor component 910 for carrying out processing functions associated with one or more of components and functions described herein. Processor component 910 can include a single or multiple set of processors or multi-core processors. Moreover, processor component 910 can be implemented as an integrated processing system and/or a distributed processing system.

BS 900 further includes a memory 920, such as for storing local versions of applications being executed by processor component 910. Memory 920 may include random access memory (RAM), read only memory (ROM), and a combination thereof.

Further, BS 900 includes a communications module 930 that provides for establishing and maintaining communications with one or more parties utilizing hardware, software, and services as described herein. Communications module 930 may carry communications between components on BS 900, as well as between BS 900 and external devices, such as access terminal 210, and including devices located across communications network and/or devices serially or locally connected to BS 900. In one aspect, communications module 930 is operable for prioritizing data packets for the purpose of providing in-order delivery of the data packets during handoff.

Additionally, BS 900 may further include storage devices 940, which can be any suitable combination of hardware and/or software that provides for mass storage of information, databases, and programs employed in connection with aspects described herein.

BS 900 may additionally include a user interface component 950 operable to receive inputs from a user of BS 900, and to generate outputs for presentation to the user. User interface component 950 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 950 may include one or more output devices, including but not limited to a display, a speaker, a haptic feedback mechanism, a printer, any other mechanism capable of presenting an output to a user, or any combination thereof.

Figure 10:
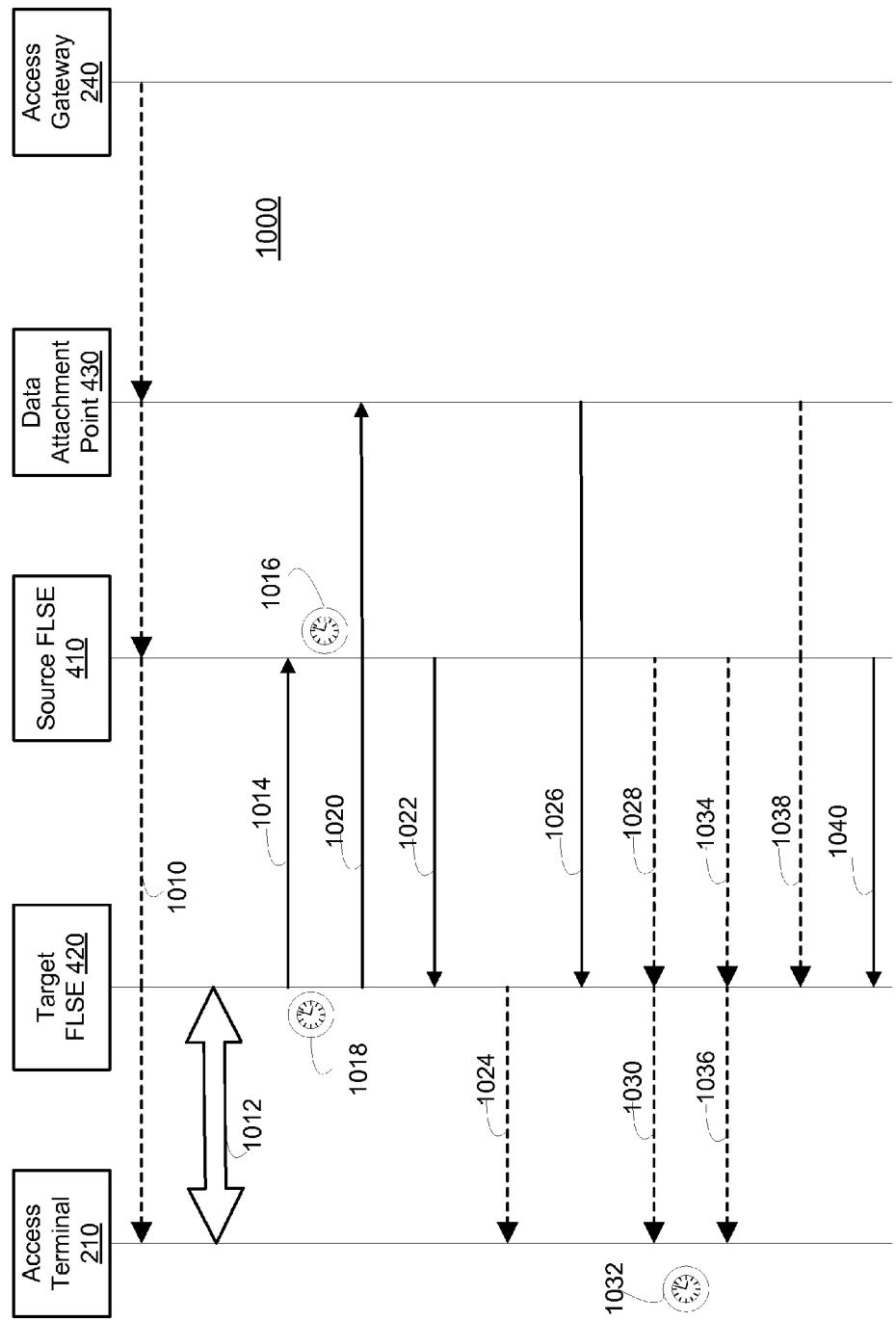
FIG. 10 is a call flow diagram for in-order packet delivery during forward link handoff between Forward Link Serving eBS (FLSE) networks, according to aspect of the present innovation.

FIG. 10 depicts a call flow diagram for in-order packet delivery during forward link handoff between Forward Link Serving eBS networks, according to aspect of the present innovation. It should be noted while the in-order packet delivery scheme illustrated in FIG. 10 is described in relation to an Ultra Mobile Broadband (UMB) network the scheme described herein is not limited to a UMB network and may be implemented in other networks that rely on Mobile Internet Protocols (MIPs) or the like.

At Event 1010, prior to hand-off, Layer 3 (L3) Internet Protocol (IP) data packets are being transmitted from the Access GateWay (AGW) 240 to the Data Attachment Point (DAP) 430 and then to source Forward Link Serving eBS (FLSE) network 410. The FLSE network 410 processes the L3 IP data packets into encapsulated Layer 2 (L2) data packets, which transmits the data packets over-the-air to the Access Terminal (AT) 210 via a reverse link protocol tunnel, referred to herein as Route 2. At Event 1012, due to signal strength considerations and/or other factors which may affect service performance, network congestion or the like, AT 210 selects target Forward Link Serving eBS (FLSE) network 420 as the serving base station (BS) on the forward link. As noted, in the UMB architecture the serving BS may be an evolved base station (eBS).

At Event 1014, target FLSE 420 sends an IPT-Notification to source FLSE 410 and, at Event 1020, target FLSE 420 sends the same IPT-Notification to Data Attachment Point (DAP) 430. The IPT-Notification sent at Events 1014 and 1020 serves to notify the receiving entities that target FLSE 420 has been selected by AT 210 as the serving base station, in other words, FLSE 420 has become the target. Additionally, the IPT-Notification is communicated to other Access Nodes (ANs) in the route set (not shown in the call flow of FIG. 10). In one aspect, after sending the IPT-Notification, at Event 1018, target FLSE 420 starts a timer to indicate a waiting period for receiving pending L3 data designated for transmission to AT 210. This timer should be reset each time a tunneled IP packet sent from the source FLSE 410 is received by the target FLSE 420. This timer is implemented to resolve instances in which an Acknowledgement (ACK) is sent from source FLSE 410 to target FLSE 420 at subsequent Event 1040 is lost or is otherwise not received properly by target FLSE 420.

At Event 1016, once source FLSE 410 receives the IPT-Notification (Event 1014) from target FLSE 420, source FLSE 410 starts a timer to indicate a waiting period for receiving IP packets. In one aspect, this timer may be set to approximately twice the backhaul delay. Once this timer expires, an ACK indicating "no pending data" and "previous FLSE" is sent to target FLSE 420 (Event 1040).

At Event 1022, source FLSE sends an IPT-Notification Acknowledgement (ACK) to target FLSE 420. The IPT-Notification ACK may additionally include indicators, such as set flags or the like, indicating "pending data" and "previous FLSE". In most instances, IPT-Notification ACK is sent without source FLSE waiting for fragments (i.e., partially processed data packets) currently in transmission to finish transmission.

Once target FLSE 420 receives the IPT-Notification ACK with indicators for "pending data" and "previous FLSE", at Event 1024, target FLSE 420 assigns Forward Link Assignment Block (FLAB) to AT 210. At Event 1026, which may precede Event 1022 and/or Event 1024, DAP 430 sends an IPT-Notification ACK to target FLSE 420.

After source FLSE sends IPT-Notification ACK, at Event 1028, source FLSE 410 tunnels L2 data packets to target FLSE 420 according to the following order. First, fragments that have started transmission but not yet finished transmission over-the-air at source FLSE 410, in other words partial packets that have not been Acknowledged as received in full by source FLSE 410 and/or any data packets that have been processed by the link-layer protocol in the source network that have corresponding peer protocol in the AT. Second, fragments of IP packets or IP packets that have not yet started transmission over-the-air at source FLSE 410. Third, a flush signal or message, such as a flush packet, is sent after sending the last fragment. The flush packet does not carry data and it is characterized as having a Radio Link Protocol (RLP) number that is the same as the sequence number of the last byte sent from the RLP at source FLSE. At Event 1030, target FLSE 420 transmits the L2 packets (i.e., Route 2 data packets encapsulated in Route 1) to AT 210.

Once the FLSE switch has occurred, at Event 1032, AT 210 starts a timer indicating the wait period for receiving the flush packet on RLP streams receiving tunneled L2 packets. This timer allows AT 210 to do in-order delivery by passing packets up from the RLP stream receiving IP packets only after passing up packets from the RLP stream receiving tunneled L2 packets. Additionally, this time is reset on receipt of every data packet.

While the IPT-Notification ACK is in transit from source FLSE 410 to target FLSE 420 and AT is still listening to source FLSE 410, the source FLSE may or may not serve AT 210 with the fragments that were currently in transmission or the fragments that have not yet started transmission. Since these fragments are being tunneled to target FLSE 420 (Event 1028), there is, in most instances, no significant advantage to also serving them on source FLSE 410. However, in certain delay-sensitive applications, such as Voice over Internet Protocol (VoIP) or the like, an advantage in terms of decreasing delay may be realized by additionally serving the fragments on source FLSE 410. Fragments may be duplicated with the L2 packets forwarded over the tunnel but At 210 is able to detect the duplication by RLP. For example, in the VoIP application, the jitter experienced could potentially be reduced by additionally serving the fragments on source FLSE 410.

At Event 1034, source FLSE sends full IP data packets across the protocol tunnel to target FLSE in Layer 2 Tunnel Protocol (L2TP), according to the priority of the full IP data packets. According to one aspect, target FLSE 420 provides scheduling priority to the tunneled L2 packets compared to the tunneled full IP packets. As such, in such aspects, target FLSE 420 starts serving the tunneled L2 packets before starting to serve the tunneled full IP packets. However, target FLSE may start serving the tunneled full IP packets while some fragments are still in transmission. Thus, it is not required that tunneled full IP packets arrive at AT 210 after receipt of tunneled L2 Packets. At Event 1036, target FLSE 420 transmits the full IP data packets to AT 210 across RLP Route 1.

AT 210 delivers packets to the applications according to the following scheme. If the flush signal or message, such as the flush packet, is received by target FLSE 420 or, the timer associated with a wait period for receiving the flush signal or message has expired at AT 210, for the RLP stream receiving tunneled L2 packets and there are no unacknowledged or missing packets, all data packets are sent to the application.

Additionally, data packets are passed from the RLP stream receiving IP packets (Target Route) to the application only after data packets have been passed up from the RLP stream receiving tunneled L2 packets (Source Route).

At Event 1038, DAP 430 initiates sending full IP packets to target FLSE 420 via an L3 tunnel, according to the priority of the packets. However, the target FLSE 420 does not serve these full IP packets until an IPT-Notification ACK with indicators for "no pending data" and "previous FLSE" is received or the timer that indicates the waiting period for receiving pending L3 data packets at target FLSE 420 has expired.

At Event 1040, after expiration of the timer that indicates that source FLSE 410 is waiting for IP packets, and no data packets are in queue to be tunneled to target FLSE 420, source FLSE 410 sends an ACK to target FLSE 420 indicating "no pending data" and "previous FLSE". Upon receipt of this ACK, target FLSE 420 can initiate serving the data packets received directly from DAP 430 after data packets received from source FLSE have been served.

In certain aspects in which the source FLSE 410 includes DAP 430, the source FLSE 410 may send the IPT-Notification ACK indicating "no pending data" and "previous FLSE" immediately after receiving the IPT-Notification (Event 1020). In such aspects, source FLSE 410 is not required to send an ACK indicating "pending data" and "previous FLSE".

Figure 11:
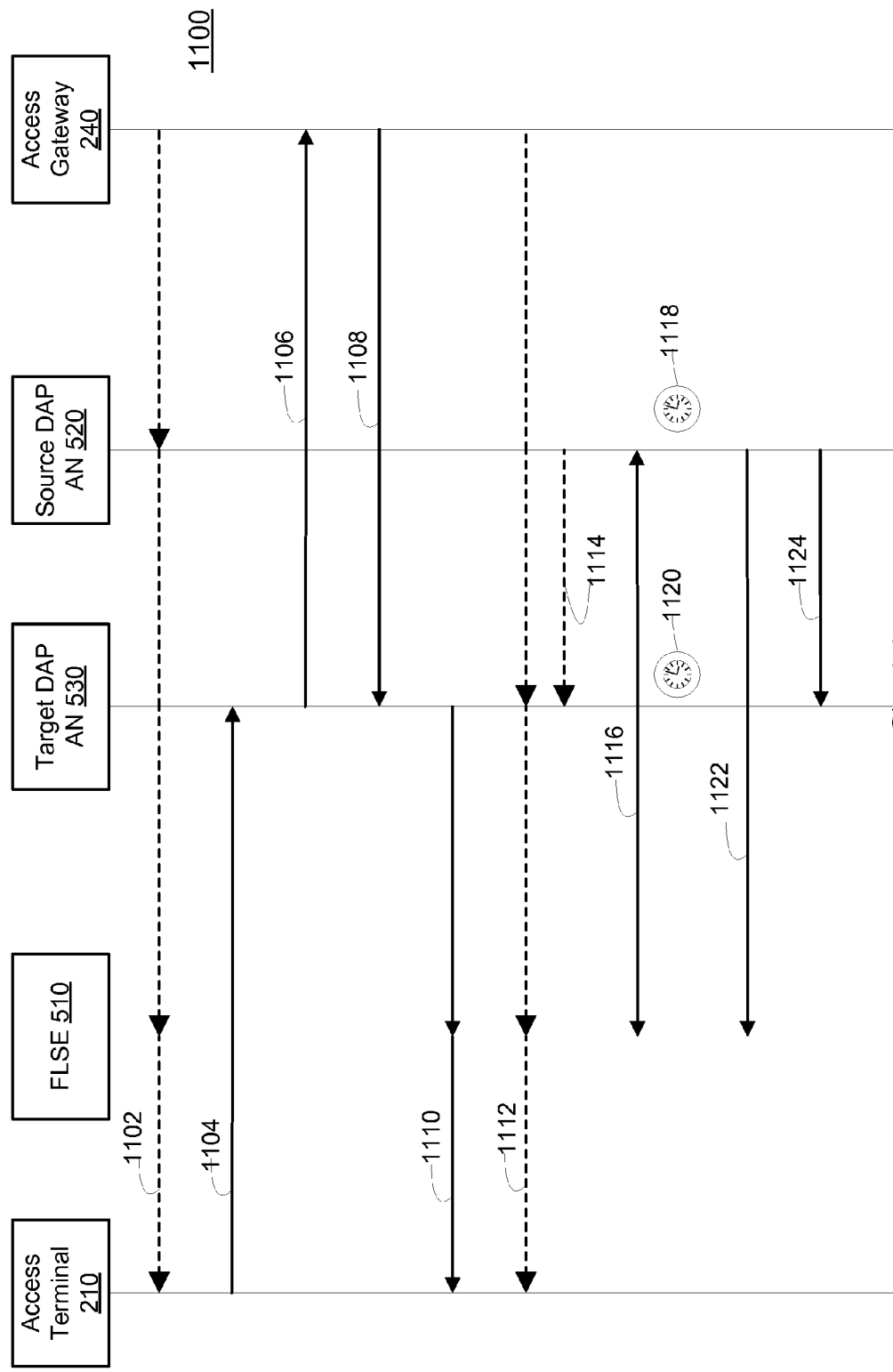
FIG. 11 is a call flow diagram for in-order packet delivery during forward link handoff between data attachment points, according to another aspect.

FIG. 11 depicts a call flow diagram for in-order packet delivery during DAP handoff between data attachment point access networks, according to one aspect of the present innovation. It should be noted while the in-order packet delivery scheme illustrated in FIG. 11 is described in relation to an Ultra Mobile Broadband (UMB) network the scheme described herein is not limited to a UMB network and may be implemented in other networks that rely on Mobile Internet Protocols (MIPs) or the like.

At Event 1102, IP data packets are transmitted from Access GateWay (AGW) 240 to source Data Attachment Point (DAP) Access Node (AN) 520, which transmits the IP data packets to Forward Link Serving eBS (FLSE) network 510 via a Layer 2 Tunnel Protocol (L2TP) tunnel. FLSE network 510 transmits the IP data packets to Access Terminal (AT) 210. At Event 1104, AT 210 sends a DAP move request to target DAP AN 530. The move request may be initiated based on a decrease in signal strength, network capacity or any other performance characteristic that warrants a DAP hand-off.

At Event 1106, target DAP AN 530 sends a registration request, such as Proxy Mobile IP (PMIP) or Mobile IP (MIP) registration request or the like, to AGW 240. Once AGW 240 has registered target DAP AN 530, at Event 1108, AGW 240 sends a registration response, such as a corresponding PMIP or MIP registration response, to target DAP AN 530. Once AGW 240 has communicated the registration response, AGW 240 can commence with forwarding data packets directly to target DAP AN 530. At Event 1110, target DAP AN 530 transmits the DAP assignment to FLSE 510, which, in turn, transmits the DAP assignment to AT 210.

At Event 1112, AGW 240 transmits full IP data packets to target DAP AN 530. At the same time that the target DAP AN 530 receives the full IP data packets, at Event 1114, the target DAP AN 530 is receiving tunneled IP packets from source DAP 520. Target DAP 530 does not serve direct IP data packets from AGW 240 until all IP data packets from source DAP AN 520 have been served. The reception of the ACK indicating "no pending data" and "previous DAP" by target DAP AN 530 (Event 1124 described infra.) informs target DAP AN 530 that the last data packet from source DAP AN 520 has been received. Further, in some aspects of DAP handoff, the transmissions by target DAP AN 530 forwarding data packets to AT 210 may omit L2 packets from the transmission.

At Event 116 target DAP AN 530 sends a DAP Notification to source DAP AN 520 and FLSE 510. Additionally, the DAP notification may be sent to other ANs in the route set (not shown in FIG. 11). Once the DAP Notification has been sent, at Event 1120, target DAP AN 530 starts a timer indicating a waiting period for pending Layer 3 (L3) data. This timer is reset each time a tunneled IP data packet is received from source DAP AN 520. The timer indicating the waiting period for pending L3 data is implemented to catch cases in which the ACK sent at Event 1124 is lost or otherwise not received. In one aspect, the value of this timer may be approximately 50 msec. Upon receipt of the DAP Notification, at Event 1118, source DAP AN 520 starts a timer indicating a waiting period for IP data packets. In one aspect, the value of this timer may be approximately equal to the one-way delay between AGW 240 and the Base Station (BS) associated with FLSE 510.

At Event 1122, source DAP 520 sends an ACK to FLSE 510, acknowledging receipt of the DAP Notification and indicating "pending data" and "previous DAP". After expiration of the timer at source DAP AN 510 indicating the waiting period for IP data packets and when no data packets are in queue to target DAP AN 530, source DAP AN 520, at Event 1124 sends an IPT-Notification ACK indicating "no pending data" and "previous DAP" to target DAP AN 530. Once target DAP AN 530 receives the ACK indicating "no pending data" and "previous DAP", target DAP AN 530 can start serving data packets to AT 210 directly from AGW 240 or, in some aspects, through FLSE 510, after serving tunneled data packets received from source DAP AN 520.

Figure 12:
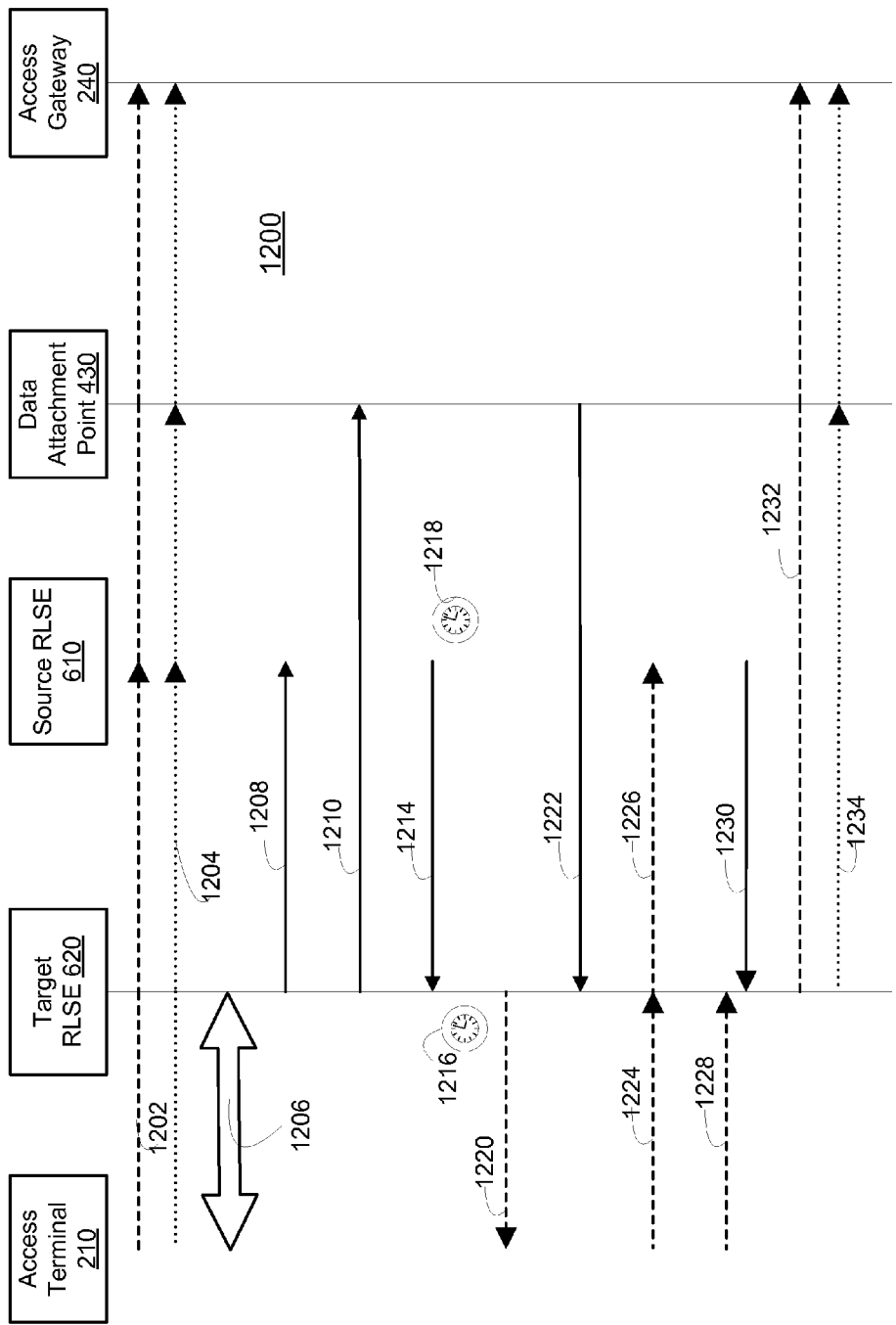
FIG. 12 is a call flow diagram for in-order packet delivery during reverse link handoff between Forward Link Serving eBS (FLSE) networks, according to aspect of the present innovation.

FIG. 12 depicts a call flow diagram for in-order packet delivery during reverse link handoff between Reverse Link Serving eBS networks, according to aspect of the present innovation. It should be noted while the in-order packet delivery scheme illustrated in FIG. 12 is described in relation to a Ultra Mobile Broadband (UMB) network the scheme described herein is not limited to a UMB network and may be implemented in other networks that rely on Mobile Internet Protocols (MIPs) or the like.

At Event 1202, prior to hand-off, data packets are being transmitted from the Access Terminal (AT) 210 to the source Reverse Link Serving eBS (RLSE) 610 network, which forwards the data packets to the Access GateWay (AGW) 240. In alternate aspects, at Event 1204, data packets are transmitted from AT 210 to source RLSE 610, which forwards the data packets to Data Attachment Point (DAP) 430 and DAP 430 forwards the data packets to AGW 240.

At Event 1206, due to signal strength considerations and/or other factors which may affect service performance, network congestion or the like, AT 210 selects target Reverse Link Serving eBS (RLSE) 620 network as the serving base station (BS) on the reverse link. As noted, in the UMB architecture the serving BS may be an evolved base station (eBS).

At Event 1208, target RLSE 620 sends an IPT-Notification to source RLSE 610 and, at Event 1210, target RLSE 620 sends the same IPT-Notification to Data Attachment Point (DAP) 430. The IPT-Notification sent at Events 1208 and 1210 serves to notify the receiving entities that target RLSE 620 has been selected by AT 210 as the serving base station, in other words RLSE 620 has become the target. Additionally, the IPT-Notification is communicated to other Access Nodes (ANs) in the route set (not shown in the call flow of FIG. 12).

At Event 1214, once source RLSE 610 receives the IPT-Notification (Event 1208) from target RLSE 620, source RLSE 610 sends an IPT-Notification Acknowledgement (ACK) to target RLSE 620. The IPT-Notification ACK may additionally include indicators, such as set flags or the like, indicating "pending data" and "previous RLSE". At Event 1218, coinciding with sending of the IPT-Notification ACK, source RLSE 610 starts a timer to indicate a waiting period for receipt of a flush signal or message, such as a flush packet, at source RLSE 610 for each RLP stream receiving tunneled L2 data packets (i.e., data requiring in-order delivery). This timer allows source RLSE 610 to finish delivering L2 packets on the source route before sending an IPT-Notification indicating "pending data" and "previous RLSE". This timer is generally reset each time a packet that changes is received on the corresponding stream.

Once target RLSE 620 has received IPT-Notification ACK indicating "pending data" and "previous RLSE", at Event 1216, a timer is started that indicates the waiting period for receiving pending Layer 3 (L3) data at target RLSE 620. This timer is implemented to resolve instances in which an IPT-Notification sent from source RLSE 610 to target RLSE 620 at subsequent Event 1230 is lost or is otherwise not received properly by target RLSE 620.

Once target RLSE 620 receives the IPT-Notification ACK with indicators for "pending data" and "previous RLSE", at Event 1220, target RLSE 620 assigns Reverse Link Assignment Block (RLAB) to AT 210. At Event 1222, which may precede Event 1220 and/or Event 1214, DAP 430 sends an IPT-Notification ACK to target RLSE 620.

After switching to target RLSE 620, at Event 1224, AT 210 sends L2 data packets on the source route to target RLSE 620, which, at Event 1226, tunnels the data packets to source RLSE 610. AT 210 sends the data packets in the following order. First, fragments that have been started transmission but not yet finished transmission over-the-air at source RLSE 610, in other words partial packets that have not been Acknowledged as received in full by source RLSE 610 and/or any data packets that have been processed by the link-layer protocol in the source network that have corresponding peer protocol in the AT. Second, fragments of IP packets that have not yet started transmission over-the-air at source RLSE 610. Third, a flush signal or message, such as a flush packet, is sent after sending the last fragment. The flush packet does not carry data and it is characterized as having a Radio Link Protocol (RLP) sequence number that is the same as the sequence number of the last byte sent from the RLP at source RLSE 610.

At Event 1228, AT 210 starts transmitting new data packets to the target RLSE 620 on the target route. For in-order delivery streams, target RLSE 620 shall not forward these data packets until the IPT-Notification indicating "no pending data" and "previous RLSE" is received from source RLSE 610 (Event 1230) or the timer indicating the waiting period for receiving pending L3 data (Event 1216) expires. This includes forwarding of the data packets to AGW 240 or DAP 430, which depends on whether IP data packets are sent directly to AGW 240 or through DAP 430. For streams that can tolerate out-of-order delivery, such as VoIP and the like, packets do not have to be buffered at target RLSE 620 and can immediately forwarded.

Once the timer indicating the period for waiting for flush signal or message, such as a flush packet (Event 1218) expires or the flush signal/message/packet is received for the RLP route receiving tunneled L2 packets and there are no unacknowledged or missing packets, at Event 1230, for all streams requiring in-order delivery, source RLSE 610 transmits an IPT-Notification indicating "no pending data" and "previous RLSE" to target RLSE 620.

Upon receiving the IPT-Notification indicating "no pending data" and "previous RLSE" or expiration of the timer indicating the waiting period for receiving pending L3 data at the target RLSE 620, at Event 1232, target RLSE 620 starts forwarding the buffered IP data packets received on target RLP route to AGW 240. Alternatively, in other aspects, upon receiving the IPT-Notification indicating "no pending data" and "previous RLSE" or expiration of the timer indicating the waiting period for receiving pending L3 data at the target RLSE 620, at Event 1234, target RLSE 620 can start forwarding the buffered IP data packets received on target RLP route to DAP 430, which forwards the data packets to AGW 240.

Figure 13:
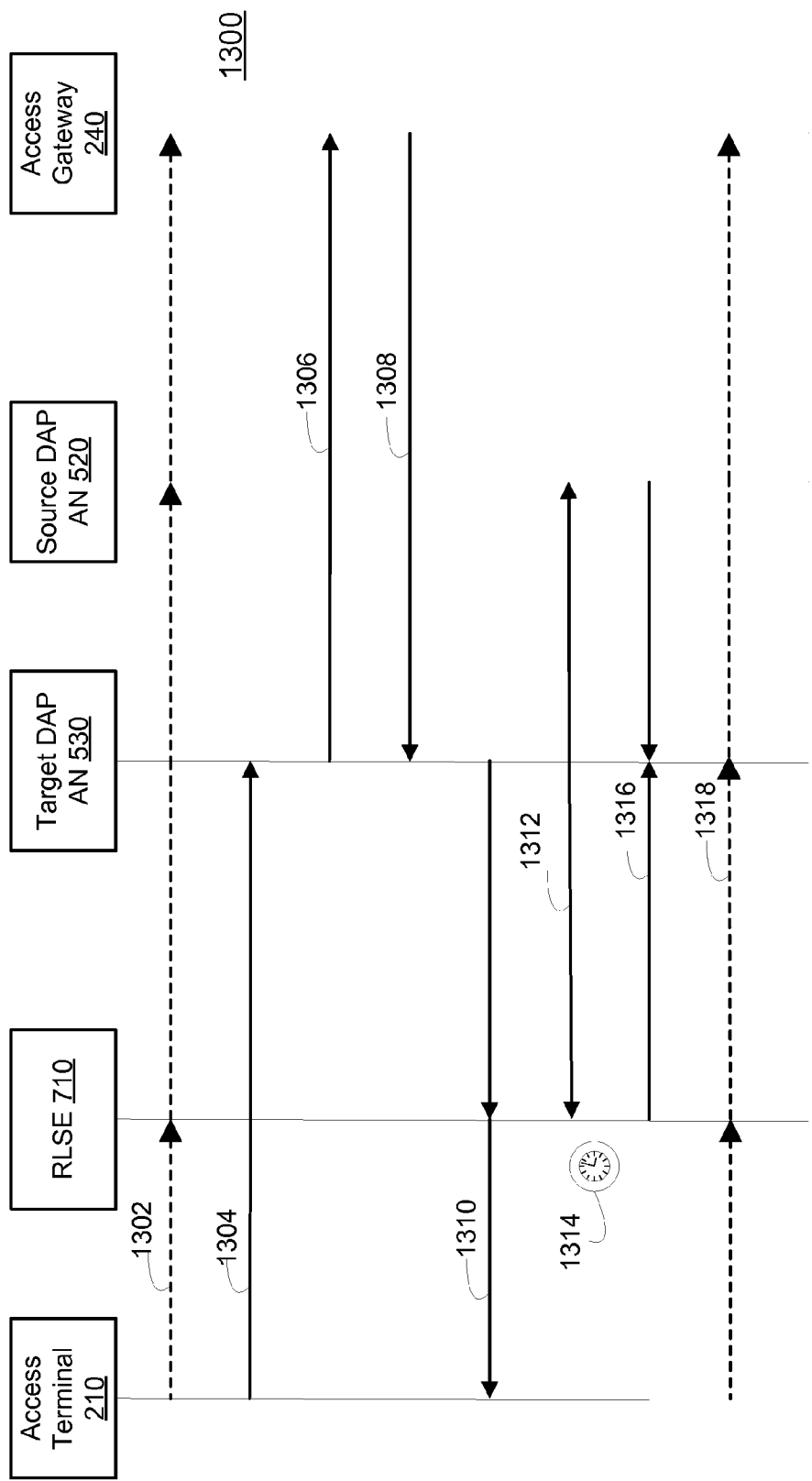
FIG. 13 is a call flow diagram for in-order packet delivery during reverse link handoff between data attachment points, according to another aspect.

FIG. 13 depicts a call flow diagram for in-order packet delivery during reverse link handoff between Data Attachment Point (DAP) Access Networks (ANs), according to aspect of the present innovation. It should be noted that the DAP switch aspect is generally relevant only if RLSE forward data packets to the DAP, which in turns forwards the data packets to the AGW and is not applicable if the RLSE forwards the data packets directly to AGW 240. It is also noted that while the in-order packet delivery scheme illustrated in FIG. 13 is described in relation to a Ultra Mobile Broadband (UMB) network the scheme described herein is not limited to a UMB network and may be implemented in other networks that rely on Mobile Internet Protocols (MIPs) or the like.

At Event 1302, data packets are transmitted from Access Terminal (AT) 210 to Reverse Link Serving eBS 710 network, which, in turn, forwards the data packets to source Data Attachment Point (DAP) 520 via a protocol tunnel. DAP 520 subsequently forwards the data packets to Access GateWay (AGW) 240. As previously noted, in instances in which RLSE 710 forwards data packets directly to AGW 240, the DAP switch does not need to be configured to process in-order delivery of data packets.

At Event 1304, AT 210 sends a DAP move request to target DAP AN 530. The move request may be initiated based on a decrease in signal strength, network capacity or any other performance characteristic that warrants a DAP hand-off.

At Event 1306, target DAP AN 530 sends a registration request, such as Proxy Mobile IP (PMIP) or Mobile IP (MIP) registration request or the like, to AGW 240. Once AGW 240 has registered target DAP AN 530, at Event 1308, AGW 240 sends a registration response, such as a corresponding PMIP or MIP registration response, to target DAP AN 530. At Event 1310, target DAP AN 530 transmits the DAP assignment to RLSE 710, which, in turn, transmits the DAP assignment to AT 210.

At Event 1312, target DAP AN 530 sends a DAP Notification to source DAP AN 520 and RLSE 710. Additionally, the DAP notification may be sent to other ANs in the route set (not shown in FIG. 13). Upon receipt of the DAP Notification, at Event 1314, RLSE 710 starts a timer indicating a waiting period for pending L3 data packets. This timer is implemented by RLSE 710 to insure that data packets sent to target DAP 530 do not get sent ahead of packets sent to source DAP 520. In one aspect, the value of this timer may be approximately equal to twice the backhaul delay between AGW 240 and the Base Station (BS) associated with RLSE 710.

Upon receipt of the DAP notification by source DAP 520 and RLSE 710, at Event 1316, source DAP 520 and RLSE 710 send a DAP Notification Acknowledgement (ACK) to target DAP AN 530, acknowledging receipt of the DAP Notification.

Once the timer indicating the waiting period for pending L3 data packets has expired at RLSE 710, at Event 1318, RLSE can start tunneling buffered data packets, received from AT 210, to target DAP 530, which, in turn forwards the data packets to AGW 240. It should be noted that in some aspects of DAP handoff, the transmissions by target DAP AN 530 forwarding data packets to AGW 240 may omit L2 packets from the transmission.

Figure 14:
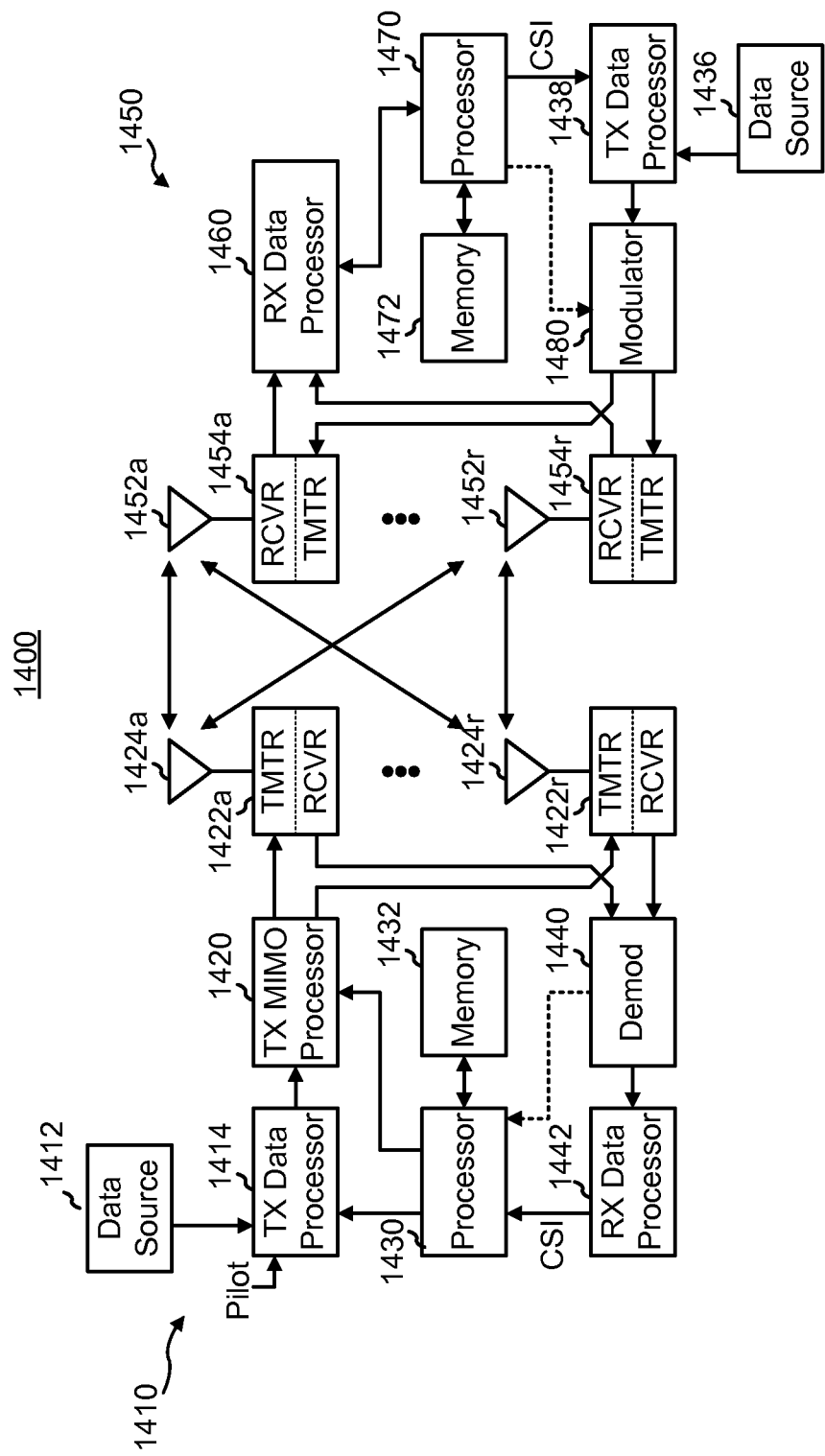
FIG. 14 is block diagram of a transmitter system and a receiver system, according to another aspect.

FIG. 14 is a block diagram of an embodiment of a transmitter system 1410 (also referred to herein as the serving access network, base station or data attachment point) and a receiver system 1450 (also known as an access terminal) in a MIMO system 1400. At the transmitter system 1410, traffic data for a number of data streams is provided from a data source 1412 to a transmit (TX) data processor 1414.

In an embodiment, each data stream is transmitted over a respective transmit antenna. TX data processor 1414 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 1430.

The modulation symbols for all data streams are then provided to a TX MIMO processor 1420, which may further process the modulation symbols (e.g., for OFDM). TX MIMO processor 1420 then provides $N_T$ modulation symbol streams to $N_T$ transmitters (TMTR) 1422a through 1422t. In certain embodiments, TX MIMO processor 1420 applies beamforming weights to the symbols of the data streams and to the antenna from which the symbol is being transmitted.

Each transmitter 1422 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 1422a through 1422t are then transmitted from $N_T$ antennas 1424a through 1424t, respectively.

At receiver system 1450, the transmitted modulated signals are received by $N_R$ antennas 1452a through 1452r and the received signal from each antenna 1452 is provided to a respective receiver (RCVR) 1454a through 1454r. Each receiver 1454 conditions (e.g., filters, amplifies, and down-converts) a respective received signal, digitizes the conditioned signal to provide samples, and further processes the samples to provide a corresponding "received" symbol stream.

An RX data processor 1460 then receives and processes the $N_R$ received symbol streams from $N_R$ receivers 1454 based on a particular receiver processing technique to provide $N_T$ "detected" symbol streams. The RX data processor 1460 then demodulates, deinterleaves, and decodes each detected symbol stream to recover the traffic data for the data stream. The processing by RX data processor 1460 is complementary to that performed by TX MIMO processor 1420 and TX data processor 1414 at transmitter system 1410.

A processor 1470 periodically determines which pre-coding matrix to use (discussed below). Processor 1470 formulates a reverse link message comprising a matrix index portion and a rank value portion.

The reverse link message may comprise various types of information regarding the communication link and/or the received data stream. The reverse link message is then processed by a TX data processor 1438, which also receives traffic data for a number of data streams from a data source 1436, modulated by a modulator 1480, conditioned by transmitters 1454a through 1454r, and transmitted back to transmitter system 1410.

At transmitter system 1410, the modulated signals from receiver system 1450 are received by antennas 1424, conditioned by receivers 1422, demodulated by a demodulator 1440, and processed by a RX data processor 1442 to extract the reserve link message transmitted by the receiver system 1450. Processor 1430 then determines which pre-coding matrix to use for determining the beamforming weights then processes the extracted message.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

Thus presents aspects herein described and claimed provide for in-order deliver of data packets during hand-off. The aspects provide for in-order delivery at Forward Link Serving eBS/Data Attachment Point (FLSE/DAP) switch and Reverse Link Serving eBS/Data Attachment Point (RLSE/DAP) switch. As such, present aspects provide for significant improvement in the throughput of applications, such as applications that rely on Transmission Control Protocol (TCP) during handoff, in such networks as UMB and the like.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for providing in-order delivery of data packets during handoff in a communication network, comprising:
    receiving data packets at a target network entity;
    prioritizing a transmission order of the received data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for transmission to the AT, wherein the second prioritization comprises prioritizing L3 data packets received from the source network entity and destined for transmission to the AT over L3 data packets received from an Access GateWay (AGW) and destined for transmission to the AT, wherein the target network entity is enabled to perform the first prioritization and the second prioritization; and
    transmitting, at the target network entity, the received data packets according to the at least one of the first prioritization or the second prioritization.

2. The method of claim 1, wherein the prioritizing comprises the first prioritization, wherein the transmitting further comprises selectively transmitting, at the target network entity, data packets received as L2 data packets before transmitting data packets received as L3 data packets, wherein the selectively transmitting is based on an application associated with data packets requiring in-order delivery.

3. The method of claim 1, wherein the L2 data packets received from the source network entity comprise partial data packets that have started transmission but not yet finished transmission over-the-air or any data packets that have been processed by a link-layer protocol in the source network entity and that have corresponding peer protocol in the AT.

4. The method of claim 1, wherein the prioritization comprises the second prioritization, wherein the second prioritization further comprises prioritizing L3 data packets received from a source Data Attachment Point (DAP) over L3 data packets received from at least one of the AGW or a target DAP.

5. The method of claim 1, wherein receiving data packets further comprises receiving from the AGW or from a target Data Attachment Point (DAP) data packets that are buffered and transmitted after the target network entity receives a flush signal or message from the source network entity indicating that the source network entity has completed transmission of L2 and L3 data packets.

6. The method of claim 1, wherein the transmitting further comprises omitting L2 data packets from the transmission when the target network entity comprises a data attachment point (DAP).

7. The method of claim 1, wherein receiving data packets further comprises receiving L2 data packets from the source network entity and L3 data packets from the AGW.

8. At least one processor configured for providing in-order delivery of data packets during handoff in a communication network, comprising:
    a first module for receiving data packets at a target network entity;
    a second module for prioritizing a transmission order of the received data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for transmission to the AT, wherein the second prioritization comprises prioritizing L3 data packets received from the source network entity and destined for transmission to the AT over L3 data packets received from an Access GateWay (AGW) and destined for transmission to the AT, wherein the target network entity is enabled to perform the first prioritization and the second prioritization; and a third module for transmitting, at the target network entity, the received data packets according to the at least one of the first prioritization or the second prioritization.

9. A computer program product, comprising:
A non-transitory computer-readable medium comprising:
a first set of codes for causing the computer to receive data packets at a target network entity;
a second set of codes for causing the computer to prioritize a transmission order of the received data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for transmission to the AT, wherein the second prioritization comprises prioritizing L3 data packets received from the source network entity and destined for transmission to the AT over L3 data packets received from an Access GateWay (AGW) and destined for transmission to the AT, wherein the target network entity is enabled to perform the first prioritization and the second prioritization; and
a third set of codes for causing the computer to transmit, at the target network entity, the received data packets according to the at least one of the first prioritization or the second prioritization.

10. An apparatus, comprising:
means for receiving data packets at a target network entity;
means for prioritizing a transmission order of the received data packets at the target network entity, wherein the prioritizing comprises at least one of a first prioritization or a second prioritization, wherein the first prioritization comprises prioritizing Layer 2 (L2) data packets received from a source network entity and destined for transmission to an Access Terminal (AT) over any received Layer 3 (L3) data packets destined for transmission to the AT, wherein the second prioritization comprises prioritizing L3 data packets received from the source network entity and destined for transmission to the AT over L3 data packets received from an Access GateWay (AGW) and destined for transmission to the AT, wherein the target network entity is enabled to perform the first prioritization and the second prioritization; and
means for transmitting, at the target network entity, the received data packets according to the at least one of the first prioritization or the second prioritization.

11. A target network apparatus, comprising:
a computer platform including a processor and a memory in communication with the processor;
a transceiver in communication with the processor, wherein the transceiver is operable to receive data packets destined for transmission to an Access Terminal (AT); and
a data packet prioritization module stored in the memory and in communication with the processor, wherein the data packet prioritization module is operable to prioritize a transmission order of the received data packets, wherein the data packet prioritization module comprises at least one of a first prioritization or a second prioritization, wherein the first prioritization comprises prioritizing Layer 2 (L2) data packets received from a source network entity and destined for transmission to the AT over any received Layer 3 (L3) data packets destined for transmission to the AT, wherein the second prioritization comprises prioritizing L3 data packets received from the source network entity and destined for transmission to the AT over L3 data packets received from an Access GateWay (AGW) and destined for transmission to the AT, wherein the target network apparatus is enabled to perform the first prioritization and the second prioritization, and to transmit the received data packets according to the at least one of the first prioritization or the second prioritization.

12. The target network apparatus of claim 11, wherein the L2 data packets comprise partial data packets that have started transmission but not yet finished transmission over-the-air or any data packets that have been processed by a link-layer protocol in the source network and that have corresponding peer protocol in the AT.

13. The target network apparatus of claim 11, wherein the data packet prioritization module comprises the second prioritization, wherein the second prioritization further comprises prioritizing L3 data packets received from a source Data Attachment Point (DAP) over L3 data packets received from at least one of the AGW or a target DAP.

14. The target network apparatus of claim 11, wherein the transceiver is further operable to receive data packets from the AGW or from a Data Attachment Point (DAP) that are buffered and transmitted after the target network apparatus receives a signal from the source network entity indicating that the source network entity has completed transmission of L2 and L3 data packets.

15. The target network apparatus of claim 11, wherein the transceiver is further operable to omit L2 data packets from the transmission when the target network apparatus comprises a data attachment point (DAP).

16. The target network apparatus of claim 11, wherein the transceiver is further operable to receive L2 data packets from the source network entity and L3 data packets from the AGW.

17. The target network apparatus of claim 11, wherein the data packet prioritization module comprises the first prioritization, wherein the data packet prioritization module is further operable to selectively transmit the data packets received as L2 data packets before transmitting the data packets received as L3 data packets, wherein the selective transmission of data packets is based on an application associated with data packets requiring in-order delivery.

18. The target network apparatus of claim 11, wherein the transceiver is further operable to receive a flush signal or message transmitted from the source network entity after transmission of L2 and L3 data packets destined for the AT, wherein the flush signal or message provides indication that no further L2 and L3 data packets are forthcoming from the source network entity.

19. A method for providing in-order delivery of data packets during handoff in a communication network, comprising:
forwarding, from a source network entity, Layer 2 (L2) data packets, destined for an Access Terminal (AT), to a target network entity; and
forwarding, from the source network entity, Layer 3 (L3) data packets, destined for the AT, to the target network entity,
wherein the forwarding of the L2 data packets is prioritized over the forwarding of the L3 data packets and the target network entity is enabled to prioritize the L3 data packets received from the source network entity and destined for transmission to the AT over L3 data packets received from an Access GateWay (AGW) and destined for transmission to the AT.

20. The method of claim 19, wherein the forwarding, from the source network entity, the L2 data packets further comprises forwarding, from the source network entity, partial data packets that have started transmission but not yet finished transmission over-the-air and forwarding, from the source network entity, the L3 data packets further comprises forwarding, from the source network entity, Internet Protocol (IP) data packets that have not yet started transmission over-the-air.

21. The method of claim 19, further comprising transmitting, from the source network entity, a signal to the target network entity indicating that the forwarding of the L2 and L3 data packets is completed.

22. The method of claim 19, further comprising transmitting, from the source network entity, a flush signal or message after forwarding of the L2 and L3 data packets, wherein the flush signal or message provides indication that no further L2 and L3 data packets are forthcoming.

23. At least one processor configured to provide in-order delivery of data packets during handoff in a communication network, comprising:
- a first module for forwarding Layer 2 (L2) data packets, destined for an Access Terminal (AT), to a target network entity; and
- a second module for forwarding Layer 3 (L3) data packets, destined for the AT, to the target network entity,
- wherein the forwarding of the L2 data packets is prioritized over the forwarding of the L3 data packets and the target network entity is enabled to prioritize L3 data packets received from a source network entity and destined for transmission to the AT over L3 data packets received from an Access GateWay (AGW) and destined for transmission to the AT.

24. A computer program product, comprising:
a non-transitory computer-readable medium comprising:
a first set of codes for causing a computer to forward Layer 2 (L2) data packets, destined for an Access Terminal (AT), to a target network entity; and
a second set of codes for causing the computer to forward Layer 3 (L3) data packets, destined for the AT, to the target network entity,
wherein the forwarding of the L2 data packets is prioritized over the forwarding of the L3 data packets and the target network entity is enabled to prioritize L3 data packets received from a source network entity and destined for transmission to the AT over L3 data packets received from an Access GateWay (AGW) and destined for transmission to the AT.

25. An apparatus, comprising:
means for forwarding Layer 2 (L2) data packets, destined for an Access Terminal (AT), to a target network entity; and
means for forwarding Layer 3 (L3) data packets, destined for the AT, to the target network entity,
wherein the forwarding of the L2 data packets is prioritized over the forwarding of the L3 data packets and the target network entity is enabled to prioritize L3 data packets received from a source network entity and destined for transmission to the AT over L3 data packets received from an Access GateWay (AGW) and destined for transmission to the AT.

26. A source network apparatus, comprising:
a computer platform including a processor and a memory in communication with the processor;
a transceiver stored in communication with the processor, wherein the transceiver is operable to forward Layer 2 (L2) data packets, destined for an Access Terminal (AT), to a target network entity and forwarding Layer 3 (L3) data packets, destined for the AT, to the target network entity; and
a data packet prioritization module stored in the memory and in communication with the processor, wherein the prioritization module is operable to prioritize the forwarding of the L2 data packets over the L3 data packets and the target network entity is enabled to prioritize the L3 data packets received from the source network apparatus and destined for transmission to the AT over L3 data packets received from an Access GateWay (AGW) and destined for transmission to the AT.

27. The source network apparatus of claim 26, wherein the transceiver is further operable to forward the L2 data packets in the form of partial data packets that have started transmission but not yet finished transmission over-the-air and forward the L3 data packets in the form of Internet Protocol (IP) data packets that have not yet started transmission over-the-air.

28. The source network apparatus of claim 26, wherein the transceiver is further operable to transmit a signal data packet to the target network entity indicating that the forwarding of the L2 and L3 data packets is completed.

29. The source network apparatus of claim 26, wherein the transceiver is further operable to transmit a flush signal or message after the forwarding of the L2 and L3 data packets, wherein the flush signal or message provides indication that no further L2 and L3 data packets are forthcoming.

30. A method for providing in-order delivery of data packets during handoff in a communication network, comprising:
receiving, at an Access Terminal (AT), L2 data packets transmitted from a source network entity;
receiving, at the AT, data packets transmitted from a target network entity, wherein the target network entity is enabled to prioritize L3 data packets received from the source network entity and destined for transmission to the AT over L3 data packets received from an Access GateWay (AGW) and destined for transmission to the AT; and
delivering the data packets to at least one respective application on the AT such that the L2 data packets transmitted from the source network entity are prioritized over the data packets transmitted from the target network entity.

31. The method of claim 30, further comprising receiving, at the AT, an indication from the source network entity that all of the L2 data packets have been transmitted from the source network entity.

32. The method of claim 31, wherein the receiving, at the AT, the data packets transmitted from the target network entity occurs only after the receiving of the indication from the source network entity.

33. The method of claim 31, further comprising transmitting, from the AT after the receiving of the indication from the source network entity, a signal to the target network entity that provides for transmission of the data packets from the target network entity.

34. The method of claim 31, wherein the data packets are buffered at the target network entity until receipt of the signal that provides for transmission of the data packets from the target network entity.

35. At least one processor configured to provide in-order delivery of data packets during handoff in a communication network, comprising:
a first module for receiving L2 data packets transmitted from a source network entity;

a second module for receiving data packets transmitted from a target network entity, wherein the target network entity is enabled to prioritize L3 data packets received from the source network entity and destined for transmission to an Access Terminal (AT) over L3 data packets received from an Access GateWay (AGW) and destined for transmission to the AT; and a third module for delivering the data packets to at least one respective application Access Terminal the AT such that the L2 data packets are prioritized over the data packets transmitted from the target network entity.

36. A computer program product, comprising:
a non-transitory computer-readable medium comprising:
a first set of codes for causing a computer to receive L2 data packets transmitted from a source network entity;
a second set of codes for causing the computer to receive data packets transmitted from a target network entity, wherein the target network entity is enabled to prioritize L3 data packets received from the source network entity and destined for transmission to an Access Terminal (AT) over L3 data packets received from an Access GateWay (AGW) and destined for transmission to the AT; and
a third set of codes for causing the computer to deliver the data packets to at least one respective application on the AT such that the L2 data packets are prioritized over the data packets transmitted from the target network entity.

37. An apparatus, comprising:
means for receiving L2 data packets transmitted from a source network entity;
means for receiving data packets transmitted from a target network entity, wherein the target network entity is enabled to prioritize L3 data packets received from the source network entity and destined for transmission to an Access Terminal (AT) over L3 data packets received from an Access GateWay (AGW) and destined for transmission to the AT; and
means for delivering the data packets to at least one respective application on the AT such that the L2 data packets are prioritized over the data packets transmitted from the target network entity.

38. An access terminal, comprising:
a computer platform including a processor and a memory in communication with the processor;
a transceiver stored in communication with the processor, wherein the transceiver is operable to receive L2 data packets transmitted from a source network entity and receive data packets transmitted from a target network entity, wherein the target network entity is enabled to prioritize L3 data packets received from the source network entity and destined for transmission to the access terminal over L3 data packets received from an Access GateWay (AGW) and destined for transmission to the access terminal, and wherein the transceiver is further operable to deliver the data packets to at least one respective application on the access terminal such that the L2 data packets transmitted from the source network entity are prioritized over the data packets transmitted from the target network entity.

39. The access terminal of claim 38, wherein the transceiver is further operable to receive an indication from the source network entity that all of the L2 data packets have been transmitted from the source network entity.

40. The access terminal of claim 39, wherein the transceiver is further operable to receive the data packets transmitted from the target network entity only after receipt of the indication from the source network entity.

41. The access terminal of claim 39, wherein the transceiver is further operable, after receipt of the indication from the source network entity, to transmit a signal to the target network entity that provides for transmission of the data packets from the target network entity.

42. The access terminal of claim 41, wherein the data packets are buffered at the target network entity until receipt of the signal that provides for transmission of the data packets from the target network entity.

43. A method for providing in-order delivery of data packets during hand-off in a communications network, comprising:
receiving, at a target network entity, L2 packets partially processed between a source network entity and an Access Terminal (AT) prior to handoff, transmitted from the AT;
forwarding, at the target network entity, the received L2 packets to the source network entity; and
receiving, at the target network entity, an indication signal transmitted from the source network entity,
wherein the indication signal indicates that all L2 packets from the AT have been forwarded to the source network entity.

44. The method of claim 43, further comprising buffering, at the target network entity, all new data packets received from the AT until the receiving of the indication signal.

45. The method of claim 43, wherein receiving, at the target network entity, the L2 packets further comprises receiving the L2 packets transmitted across a L2 protocol tunnel.

46. At least one processor configured to provide in-order delivery of data packets during handoff in a communication network, comprising:
a first module for receiving, at a target network entity, L2 packets partially processed between a source network entity and an Access Terminal (AT) prior to handoff, transmitted from the AT;
a second module for forwarding, at the target network entity, the received L2 packets to the source network entity; and
a third module for receiving, at the target network entity, an indication signal transmitted from the source network entity,
wherein the indication signal indicates that all L2 packets from the AT have been forwarded to the source network entity.

47. A computer program product, comprising:
a non-transitory computer-readable medium comprising:
a first set of codes for causing a computer to receive, at a target network entity, L2 packets partially processed between a source network entity and an Access Terminal (AT) prior to handoff; transmitted from the AT;
a second set of codes for causing a computer to forward, at the target network entity, the received L2 packets to the source network entity; and
a third set of codes for causing the computer to receive, at the target network entity, an indication signal transmitted from the source network entity,
wherein the indication signal indicates that all L2 packets from the AT have been forwarded to the source network entity.

48. An apparatus, comprising:
means for receiving, at a target network entity, L2 packets partially processed between a source network entity and an Access Terminal (AT) prior to handoff, transmitted from the AT;
means for forwarding, at the target network entity, the received L2 packets to the source network entity; and means for receiving, at the target network entity, an indication signal from the Source network entity,
wherein the indication signal indicates that all L2 packets from the AT have been forwarded to the source network entity.

49. A target network entity, comprising:
a computer platform including a processor and a memory in communication with the processor;
a transceiver in communication with the processor, wherein the transceiver is operable to receive L2 packets partially processed between a source network entity and an Access Terminal (AT) and transmitted from the AT, forward the received L2 packets to the source network entity and receive an indication signal from the source network entity, wherein the indication signal indicates that all L2 packets from the AT have been forwarded to the source network entity.

50. The target network entity of claim 49, wherein the transceiver is further operable buffer, at the target network entity, all new data packets received from the AT until the receiving of the indication signal.

51. The target network entity of claim 49, wherein the transceiver is further operable to receive the L2 packets transmitted across a L2 protocol tunnel.

52. A method for providing in-order delivery of data packets during hand-off in a communications network, comprising:
transmitting L2 data packets partially processed between a source network entity and an Access Terminal (AT) prior to handoff to the source network entity via a target network entity; and
transmitting, by the AT, new data packets to the target network entity,
wherein the target network entity forwards the L2 data packets to the source network entity and the source network entity sends all IP data packets constructed from the L2 data packets to an Access Gateway (AGW) prior to sending the new data packets by the AT.

53. At least one processor configured to provide in-order delivery of data packets during handoff in a communication network, comprising:
a first module for transmitting L2 data packets partially processed between a source network entity and an Access Terminal (AT) prior to handoff to the source network entity via a target network entity; and
a second module for transmitting, by the AT, new data packets to the target network entity,
wherein the target network entity forwards the L2 data packets to the source network entity and the source network entity sends all IP data packets constructed from the L2 data packets to an Access Gateway (AGW) prior to sending the new data packets by the AT.

54. A computer program product, comprising:
a non-transitory computer-readable medium comprising:
a first set of codes for causing the computer to transmit L2 data packets partially processed between a source network entity and an Access Terminal (AT) prior to handoff to the source network entity via the a target network entity; and
a second set of codes for causing the computer to transmit, by the AT, new data packets to the target network entity,
wherein the target network entity forwards the L2 data packets to the source network entity and the source network entity sends all IP data packets constructed from the L2 data packets to an Access Gateway (AGW) prior to sending the new data packets by the AT.

55. An apparatus, comprising:
means for transmitting L2 data packets partially processed between a source network entity and an Access Terminal (AT) prior to handoff to the source network entity via a target network entity; and
means for transmitting, by the AT, new data packets to the target network entity,
wherein the target network entity forwards the L2 data packets to the source network entity and the source network entity sends all IP data packets constructed from the L2 data packets to an Access Gateway (AGW) prior to sending the new data packets by the AT.

56. An access terminal, comprising:
a computer platform including a processor and a memory in communication with the processor;
a transceiver in communication with the processor, wherein the transceiver is operable to transmit L2 data packets partially processed between a source network entity and the access terminal prior to handoff to the source network entity via to a target network entity and transmit, by the access terminal, new data packets to the target network entity, wherein the target network entity forwards the L2 data packets to the source network entity and the source network entity sends all IP data packets constructed from L2 data packets to an Access Gateway (AGW) prior to sending the new data packets by the access terminal.

* * * * *